(12) United States Patent
Hayakawa et al.

(10) Patent No.: US 7,834,355 B2
(45) Date of Patent: Nov. 16, 2010

(54) DISPLAY DEVICE AND ELECTRONIC DEVICE

(75) Inventors: Masahiko Hayakawa, Kanagawa (JP); Yu Yamazaki, Kanagawa (JP); Yukari Ando, Gifu (JP); Keisuke Miyagawa, Kanagawa (JP); Jun Koyama, Kanagawa (JP); Mitsuaki Osame, Kanagawa (JP); Aya Anzai, Kanagawa (JP); Shunpei Yamazaki, Tokyo (JP); Satoshi Seo, Kanagawa (JP); Hiroko Abe, Tokyo (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 18 days.

(21) Appl. No.: 12/348,574

(22) Filed: Jan. 5, 2009

(65) Prior Publication Data

US 2009/0174333 A1 Jul. 9, 2009

Related U.S. Application Data

(62) Division of application No. 11/123,209, filed on May 6, 2005, now Pat. No. 7,482,629.

(30) Foreign Application Priority Data

May 21, 2004 (JP) .............................. 2004-152624
Jun. 29, 2004 (JP) .............................. 2004-191833

(51) Int. Cl.
*H01L 29/04* (2006.01)
(52) U.S. Cl. .......................................... 257/59; 257/79
(58) Field of Classification Search ................... 257/59, 257/79
See application file for complete search history.

(56) References Cited

U.S. PATENT DOCUMENTS 4,672,199 A 6/1987 Anderson et al.

(Continued)

FOREIGN PATENT DOCUMENTS

CN 1329368 1/2002

(Continued)

OTHER PUBLICATIONS

Shimoda.T et al., "Current Status and Future of Light-Emitting Polymer Display Driven by Poly-Si TFT,", SID Digest '99 : SID International Symposium Digest of Technical Papers, May 18, 1999, pp. 372-375.

(Continued)

*Primary Examiner*—Long Pham
(74) *Attorney, Agent, or Firm*—Fish & Richardson P.C.

(57) ABSTRACT

A display device where the influence of variations in current of the light emitting element due to changes in ambient temperature and changes with time can be suppressed. The display device of the invention has a light emitting element, a driving transistor connected in series to the light emitting element, a monitoring light emitting element, a limiter transistor connected in series to the monitoring light emitting element, a constant current source for supplying a constant current to the monitoring light emitting element, and a circuit for outputting a potential equal to an inputted potential. A first electrode of the light emitting element is connected to an output terminal of the circuit through the driving transistor, and a first electrode of the monitoring light emitting element is connected to an input terminal of the circuit through the limiter transistor. The channel length L1 and the channel width W1 of the driving transistor, and the channel length L2 and the channel width W2 of the limiter transistor satisfy L1/W1:L2/W2=1:2 to 1:10.

26 Claims, 27 Drawing Sheets

U.S. PATENT DOCUMENTS

| | | | |
|---|---|---|---|
| 5,027,036 | A | 6/1991 | Ikarashi et al. |
| 5,247,190 | A | 9/1993 | Friend et al. |
| 5,399,502 | A | 3/1995 | Friend et al. |
| 5,594,463 | A | 1/1997 | Sakamoto |
| 5,708,451 | A | 1/1998 | Baldi |
| 5,778,146 | A | 7/1998 | Kawasaki et al. |
| 5,936,603 | A | 8/1999 | Lippmann et al. |
| 6,127,991 | A | 10/2000 | Uehara et al. |
| 6,219,017 | B1 | 4/2001 | Shimada et al. |
| 6,249,268 | B1 | 6/2001 | Tachibana et al. |
| 6,456,337 | B1 | 9/2002 | Kobayashi et al. |
| 6,473,065 | B1 | 10/2002 | Fan |
| 6,479,940 | B1 | 11/2002 | Ishizuka |
| 6,501,230 | B1 | 12/2002 | Feldman |
| 6,528,951 | B2 | 3/2003 | Yamazaki et al. |
| 6,542,260 | B1 | 4/2003 | Gann et al. |
| 6,618,084 | B1 | 9/2003 | Rambaldi et al. |
| 6,628,848 | B1 | 9/2003 | Nakamura |
| 6,661,180 | B2 | 12/2003 | Koyama |
| 6,670,937 | B1 | 12/2003 | Tsuboyama et al. |
| 6,677,621 | B2 | 1/2004 | Yamazaki et al. |
| 6,753,856 | B1 | 6/2004 | Krah et al. |
| 6,762,743 | B2 | 7/2004 | Yoshihara et al. |
| 6,774,578 | B2 | 8/2004 | Tanada |
| 6,806,871 | B1 | 10/2004 | Yasue |
| 6,828,950 | B2 | 12/2004 | Koyama |
| 6,870,192 | B2 | 3/2005 | Yamazaki et al. |
| 6,888,529 | B2 | 5/2005 | Bruning et al. |
| 6,911,781 | B2 | 6/2005 | Yamazaki et al. |
| 6,963,321 | B2 | 11/2005 | Everitt |
| 6,995,737 | B2 | 2/2006 | LeChevalier |
| 7,180,515 | B2 | 2/2007 | Miyagawa et al. |
| 7,298,347 | B2 | 11/2007 | Yamazaki et al. |
| 2001/0020922 | A1 | 9/2001 | Yamazaki et al. |
| 2001/0030511 | A1 | 10/2001 | Yamazaki et al. |
| 2001/0033252 | A1 | 10/2001 | Yamazaki et al. |
| 2002/0005696 | A1 | 1/2002 | Yamazaki et al. |
| 2002/0017643 | A1 | 2/2002 | Koyama |
| 2002/0033783 | A1 | 3/2002 | Koyama |
| 2003/0048243 | A1 | 3/2003 | Kwasnick |
| 2003/0063053 | A1 | 4/2003 | Yamazaki et al. |
| 2003/0071804 | A1 | 4/2003 | Yamazaki et al. |
| 2003/0071821 | A1 | 4/2003 | Sundahl et al. |
| 2003/0132716 | A1 | 7/2003 | Yamazaki et al. |
| 2003/0209989 | A1 | 11/2003 | Anzai et al. |
| 2003/0214467 | A1 | 11/2003 | Koyama et al. |
| 2003/0214521 | A1 | 11/2003 | Osame et al. |
| 2004/0004590 | A1 | 1/2004 | LeChevalier |
| 2004/0027320 | A1 | 2/2004 | Ochi et al. |
| 2004/0100463 | A1 | 5/2004 | Miyagawa et al. |
| 2004/0150594 | A1 | 8/2004 | Koyama et al. |
| 2004/0173811 | A1 | 9/2004 | Yamazaki et al. |
| 2005/0012731 | A1 | 1/2005 | Yamazaki et al. |
| 2005/0017933 | A1 | 1/2005 | Koyama |
| 2005/0017963 | A1 | 1/2005 | Yamazaki et al. |
| 2005/0017964 | A1 | 1/2005 | Yamazaki et al. |
| 2005/0285823 | A1 | 12/2005 | Kimura et al. |
| 2006/0022206 | A1 | 2/2006 | Hayakawa et al. |
| 2006/0038804 | A1 | 2/2006 | Hayakawa et al. |
| 2006/0202924 | A1 | 9/2006 | Koyama |
| 2007/0182675 | A1 | 8/2007 | Yamazaki et al. |

FOREIGN PATENT DOCUMENTS

| | | |
|---|---|---|
| EP | 1117085 | 7/2001 |
| EP | 1148466 | 10/2001 |
| EP | 1160889 | 12/2001 |
| EP | 1168291 | 1/2002 |
| EP | 1355289 | 10/2003 |
| JP | 61-261921 | 11/1986 |
| JP | 02-143297 | 6/1990 |
| JP | 07-122361 | 5/1995 |
| JP | 11-015437 | 1/1999 |
| JP | 11-305722 | 11/1999 |
| JP | 2000-347622 | 12/2000 |
| JP | 2001-035655 | 2/2001 |
| JP | 2001-134197 | 5/2001 |
| JP | 2001-272968 | 10/2001 |
| JP | 2001-331144 | 11/2001 |
| JP | 2002-050484 | 2/2002 |
| JP | 2002-072964 | 3/2002 |
| JP | 2002-123217 | 4/2002 |
| JP | 2002-123219 | 4/2002 |
| JP | 2002-175041 | 6/2002 |
| JP | 2002-175046 | 6/2002 |
| JP | 2002-229513 | 8/2002 |
| JP | 2002-278514 | 9/2002 |
| JP | 2002-333861 | 11/2002 |
| JP | 2002-351403 | 12/2002 |
| JP | 2003-029710 | 1/2003 |
| JP | 3390214 | 3/2003 |
| JP | 2003-323159 | 11/2003 |
| JP | 2004-004759 | 1/2004 |
| WO | WO-2004/040541 | 5/2004 |

OTHER PUBLICATIONS

Han.C et al., "3.8 Green Oled With Low Temperature Poly Si TFT,", Eurodisplay '99: Proceedings of the 19th IDRC (International Display Research Conference) Late-News Papers, Sep. 6, 1999, pp. 27-30.

Shimoda.T et al., "High Resolution Light Emitting Polymer Display Driven by Low Temperature Polysilicon Thin Film Transistor With Integrated Driver,", Asia Display '98: Proceedings of the 18th IDRC (International Display Research Conference), 1998, pp. 217-220.

International Search Report (Application No. PCT/JP2005/013682) Dated Oct. 25, 2005, 3 pages.

Written Opinion (Application No. PCT/JP2005/013682) Dated Oct. 25, 2005, 3 pages.

Office Action (Application No. 200510073701.9) Dated Feb. 22, 2008, 19 pages.

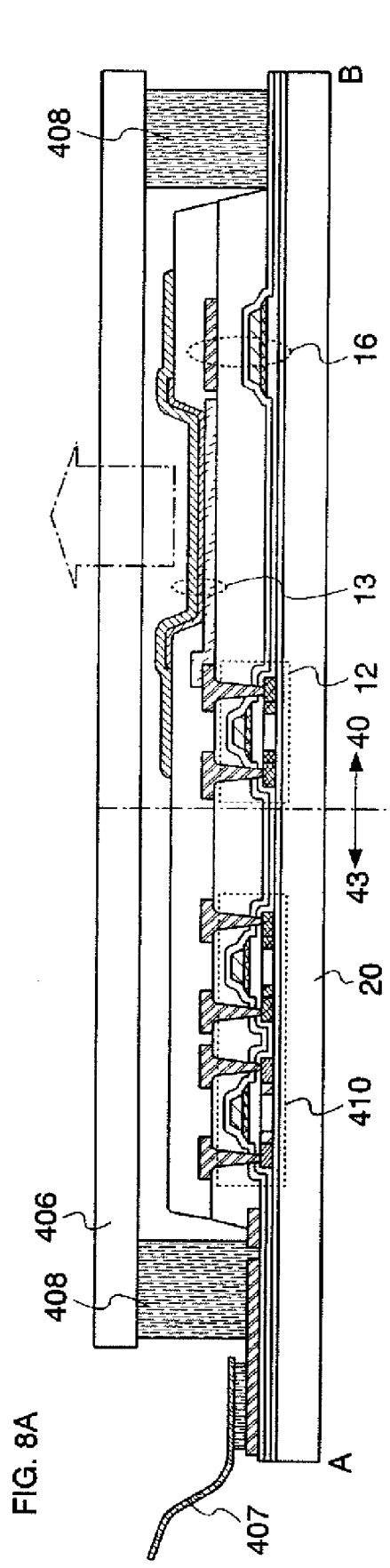
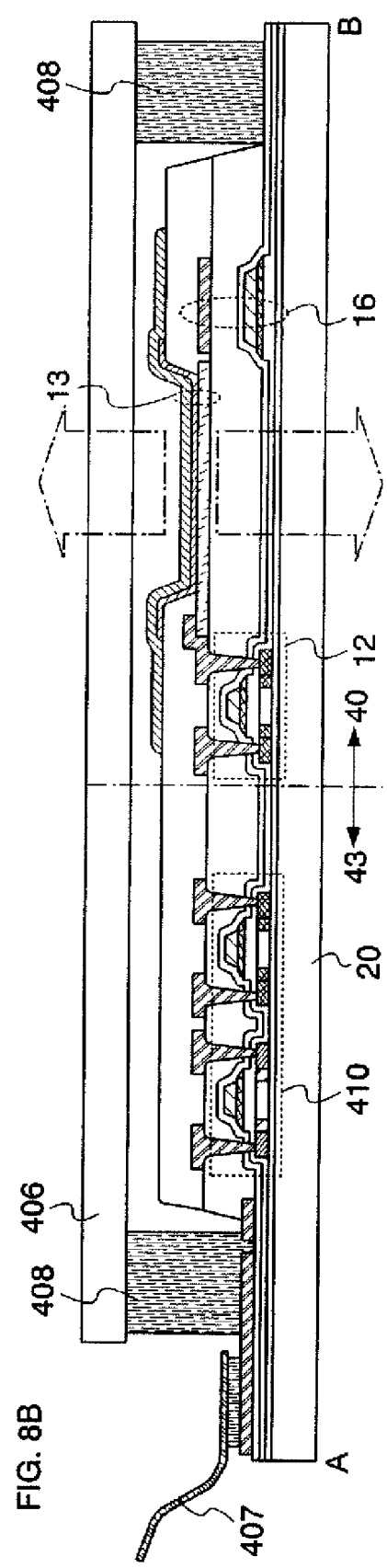
FIG. 8A
FIG. 8B toward column signal line

DISPLAY DEVICE AND ELECTRONIC DEVICE

CROSS-REFERENCE TO RELATED APPLICATIONS

This application is a divisional of U.S. application Ser. No. 11/123,209, filed May 6, 2005, now allowed, which claims the benefit of foreign priority applications filed in Japan as Serial No. 2004-152624 on May 21, 2004 and Serial No. 2004-191833 on Jun. 29, 2004, both of which are incorporated by reference.

BACKGROUND OF THE INVENTION

1. Field of the Invention

The present invention relates to a display device and a television device each having a light emitting element.

The invention further relates to an electronic device that uses a display device having a light emitting element.

2. Description of the Related Art

In recent years, a display device having a light emitting element typified by an EL (Electroluminescence) element has been actively developed, and it is expected to be widely used by taking advantages of the light emitting element such as high image quality, wide viewing angle, and reduced thickness and weight.

The light emitting element has the characteristic that its resistance (internal resistance) varies with the surrounding temperature (hereinafter referred to as ambient temperature). Specifically, the resistance decreases when the temperature is more than room temperature, while the resistance increases when the temperature is less than room temperature. Such a characteristic of the light emitting element is shown in a graph of FIG. 10A showing the relation between voltage-current characteristics of the light emitting element and temperature. The light emitting element also has the characteristic that its current decreases with time. Such a characteristic of the light emitting element is shown in a graph of FIG. 10B showing the relation between voltage-current characteristics of the light emitting element and time.

SUMMARY OF THE INVENTION

The aforementioned characteristics of the light emitting element cause variations in luminance with changes in ambient temperature or changes with time. In view of the foregoing, the invention provides a display device where the influence of variations in current of the light emitting element due to changes in ambient temperature and changes with time can be suppressed.

In view of the foregoing, the invention provides a display device having a correction function for changes in ambient temperature and a correction function for changes with time (hereinafter collectively referred to as a correction function).

A display device of the invention has a light emitting element, a driving transistor connected in series to the light emitting element, a monitoring light emitting element, a limiter transistor connected in series to the monitoring light emitting element, a constant current source for supplying a constant current to the monitoring light emitting element, and a buffer amplifier. A first electrode of the light emitting element is connected to an output terminal of the buffer amplifier through the driving transistor. A first electrode of the monitoring light emitting element is connected to an input terminal of the buffer amplifier through the limiter transistor. The channel length (L1) and the channel width (W1) of the driving transistor, and the channel length (L2) and the channel width (W2) of the limiter transistor satisfy L1/W1:L2/W2=1:2 to 1:10. The limiter transistor is on all the time.

A display device of the invention has a light emitting element, a monitoring light emitting element, an AC transistor connected in series to the monitoring light emitting element, a constant current source for supplying a constant current to the monitoring light emitting element, and a buffer amplifier. A first electrode of the light emitting element is electrically connected to an output terminal of the buffer amplifier. A first electrode of the monitoring light emitting element, a gate electrode of the AC transistor, and one of a source electrode and a drain electrode of the AC transistor are connected to an input terminal of the buffer amplifier. The other of the source electrode and the drain electrode of the AC transistor is connected to an AC power supply.

A display device of the invention has a light emitting element, a monitoring light emitting element, a constant current source for supplying a constant current to the monitoring light emitting element, a buffer amplifier, a capacitor connected to an input terminal of the buffer amplifier, a first switch provided between a first electrode of the light emitting element and an output terminal of the buffer amplifier, a second switch provided between the first electrode of the light emitting element and an AC power supply, a third switch provided between a first electrode of the monitoring light emitting element and the input terminal of the buffer amplifier, and a fourth switch provided between the first electrode of the monitoring light emitting element and the AC power supply.

The display device of the invention has a control circuit for applying a forward bias voltage to the light emitting element and the monitoring light emitting element while bringing the first switch and the third switch into a conductive state whereas the second switch and the fourth switch into a non-conductive state. The display device of the invention further has a control circuit for applying a reverse bias voltage to the light emitting element and the monitoring light emitting element while bringing the first switch and the third switch into a non-conductive state whereas the second switch and the fourth switch into a conductive state.

A display device of the invention has a light emitting element, a monitoring light emitting element, a current source transistor connected in series to the monitoring light emitting element, and a buffer amplifier. A first electrode of the light emitting element is electrically connected to an output terminal of the buffer amplifier. A first electrode of the monitoring light emitting element and one of a source electrode and a drain electrode of the current source transistor is connected to an input terminal of the buffer amplifier. A gate electrode of the current source transistor is connected to a first power supply, and the other of the source electrode and the drain electrode of the current source transistor is connected to a second power supply. The current source transistor operates in a saturation region.

A display device of the invention has a light emitting element, a monitoring light emitting element, a constant current source for supplying a constant current to the monitoring light emitting element, a buffer amplifier, and a resistor provided between a first electrode of the monitoring light emitting element and an input terminal of the buffer amplifier. A first electrode of the light emitting element is electrically connected to an output terminal of the buffer amplifier.

A display device of the invention has a light emitting element, a switching transistor, a monitoring light emitting element, a forward bias transistor connected in series to the monitoring light emitting element, a constant current source for supplying a constant current to the monitoring light emitting element, and a buffer amplifier. A first electrode of the light emitting element is electrically connected to an output terminal of the buffer amplifier. A first electrode of the monitoring light emitting element is connected to an input terminal of the buffer amplifier. A gate electrode of the switching transistor and a gate electrode of the forward bias transistor are connected to a gate line. One of a source electrode and a drain electrode of the forward bias transistor is connected to the input terminal of the buffer amplifier while the other thereof is connected to a forward bias power supply.

A display device of the invention has a pixel area including a plurality of pixels, a source driver, a first gate driver, and a second gate driver. Each of the pixels has a light emitting element, a first transistor for controlling video signal input to the pixel, a second transistor for controlling light emission or non-light emission of the light emitting element, and a capacitor for holding the video signal. The capacitor has a first conductive layer formed on the same layer as gate electrodes of the first transistor and the second transistor, a second conductive layer formed on the same layer as source and drain wirings of the first transistor and the second transistor, and an insulating layer formed between the first conductive layer and the second conductive layer.

A display device of the invention has a pixel area including a plurality of pixels, a source driver, a first gate driver, and a second gate driver. Each of the pixels has a light emitting element, a first transistor for controlling video signal input to the pixel, a second transistor for controlling light emission or non-light emission of the light emitting element, and a capacitor for holding the video signal. The capacitor has a first conductive layer formed on the same layer as source and drain wirings of the first transistor and the second transistor, a second conductive layer formed on the same layer as a pixel electrode of the light emitting element, and an insulating layer formed between the first conductive layer and the second conductive layer.

The invention provides a display device having a displaying white light emitting element (light emitting element that emits white light) as well as a monitoring white light emitting element. Changes in ambient temperature and changes with time are detected by the monitoring white light emitting element, and the result thereof is reflected in a power supply potential of the displaying white light emitting element.

More specifically, the displaying white light emitting element operates with a constant voltage drive while the monitoring white light emitting element operates with a constant current drive. In the constant voltage drive, a constant voltage is applied to the light emitting element, whereas in the constant current drive, a constant current is supplied to the light emitting element. When the monitoring white light emitting element operates with the constant current drive, changes in ambient temperature and changes with time are shown as a potential difference of the monitoring white light emitting element. When such changes in potential difference of the monitoring white light emitting element are reflected in a power supply potential of the displaying white light emitting element, changes in ambient temperature and changes with time can be corrected.

The invention provides a display device where a white light emitting element has a duty ratio of 45 to 80% and a monitoring white light emitting element has a duty ratio of 45 to 100%. The duty ratio of the white light emitting element is the average duty ratio of all the white light emitting elements provided in a pixel area. The duty ratio is the ratio of a lighting period to a lighting period and a non-light emitting period such as a writing period when all the inputted video signals display white.

The invention provides a display device where the total amount of current in a white light emitting element during a certain period is less than the total amount of current in a monitoring white light emitting element.

In this manner, the load on the white light emitting element differs from the load on the monitoring white light emitting element, and luminance decay is taken into consideration based on the amount of charge flowing through the white light emitting element. Accordingly, constant luminance drive can be performed where the amount of charge in the white light emitting element is compared with the amount of charge in the monitoring white light emitting element, and the luminance of the white light emitting element is corrected so as to be constant.

A display device of the invention has a white light emitting element, a driving transistor connected in series to the white light emitting element, a monitoring white light emitting element, a limiter transistor connected in series to the monitoring white light emitting element, a constant current source for supplying a constant current to the monitoring white light emitting element, a buffer amplifier, and a colored layer. A first electrode of the white light emitting element is connected to an output terminal of the buffer amplifier through the driving transistor. A first electrode of the monitoring white light emitting element is connected to an input terminal of the buffer amplifier through the limiter transistor. The channel length (L1) and the channel width (W1) of the driving transistor, and the channel length (L2) and the channel width (W2) of the limiter transistor satisfy L1/W1:L2/W2=1:2 to 1:10. The white light emitting element is provided so as to overlap the colored layer. The limiter transistor is on all the time.

A display device of the invention has a white light emitting element, a monitoring white light emitting element, an AC transistor connected in series to the monitoring white light emitting element, a constant current source for supplying a constant current to the monitoring white light emitting element, a buffer amplifier, and a colored layer. A first electrode of the white light emitting element is electrically connected to an output terminal of the buffer amplifier. A first electrode of the monitoring white light emitting element, a gate electrode of the AC transistor, and one of a source electrode and a drain electrode of the AC transistor are connected to an input terminal of the buffer amplifier. The other of the source electrode and the drain electrode of the AC transistor is connected to an AC power supply. The white light emitting element is provided so as to overlap the colored layer.

A display device of the invention has a white light emitting element, a monitoring white light emitting element, a constant current source for supplying a constant current to the monitoring white light emitting element, a buffer amplifier, a colored layer, a capacitor connected to an input terminal of the buffer amplifier, a first switch provided between a first electrode of the white light emitting element and an output terminal of the buffer amplifier, a second switch provided between the first electrode of the white light emitting element and an AC power supply, a third switch provided between a first electrode of the monitoring white light emitting element and the input terminal of the buffer amplifier, and a fourth switch provided between the first electrode of the monitoring white light emitting element and the AC power supply. The white light emitting element is provided so as to overlap the colored layer.

The display device of the invention has a control circuit for applying a forward bias voltage to the white light emitting element and the monitoring white light emitting element while bringing the first switch and the third switch into a conductive state whereas the second switch and the fourth switch into a non-conductive state. The display device of the invention further has a control circuit for applying a reverse bias voltage to the white light emitting element and the monitoring white light emitting element while bringing the first switch and the third switch into a non-conductive state whereas the second switch and the fourth switch into a conductive state. The white light emitting element is provided so as to overlap the colored layer.

A display device of the invention has a white light emitting element, a monitoring white light emitting element, a current source transistor connected in series to the monitoring white light emitting element, a buffer amplifier, and a colored layer. A first electrode of the white light emitting element is electrically connected to an output terminal of the buffer amplifier. A first electrode of the monitoring white light emitting element and one of a source electrode and a drain electrode of the current source transistor are connected to an input terminal of the buffer amplifier. A gate electrode of the current source transistor is connected to a first power supply. The other of the source electrode and the drain electrode of the current source transistor is connected to a second power supply. The white light emitting element is provided so as to overlap the colored layer. The current source transistor operates in a saturation region.

A display device of the invention has a white light emitting element, a monitoring white light emitting element, a constant current source for supplying a constant current to the monitoring white light emitting element, a buffer amplifier, a colored layer, and a resistor provided between a first electrode of the monitoring white light emitting element and an input terminal of the buffer amplifier. A first electrode of the white light emitting element is electrically connected to an output terminal of the buffer amplifier. The white light emitting element is provided so as to overlap the colored layer.

A display device of the invention has a white light emitting element, a switching transistor, a monitoring white light emitting element, a forward bias transistor connected in series to the monitoring white light emitting element, a constant current source for supplying a constant current to the monitoring white light emitting element, a buffer amplifier, and a colored layer. A first electrode of the white light emitting element is electrically connected to an output terminal of the buffer amplifier. A first electrode of the monitoring white light emitting element is connected to an input terminal of the buffer amplifier. A gate electrode of the switching transistor and a gate electrode of the forward bias transistor are connected to a gate line. One of a source electrode and a drain electrode of the forward bias transistor is connected to the input terminal of the buffer amplifier, and the other thereof is connected to a forward bias power supply. The white light emitting element is provided so as to overlap the colored layer.

The invention having the aforementioned structures can provide a display device where the influence of variations in current of the light emitting element due to changes in ambient temperature and changes with time can be suppressed.

BRIEF DESCRIPTION OF THE DRAWINGS

FIGS. 8A and 8B are diagrams each showing a panel that is one mode of the display device of the invention.

DETAILED DESCRIPTION OF THE INVENTION

Figure 1:
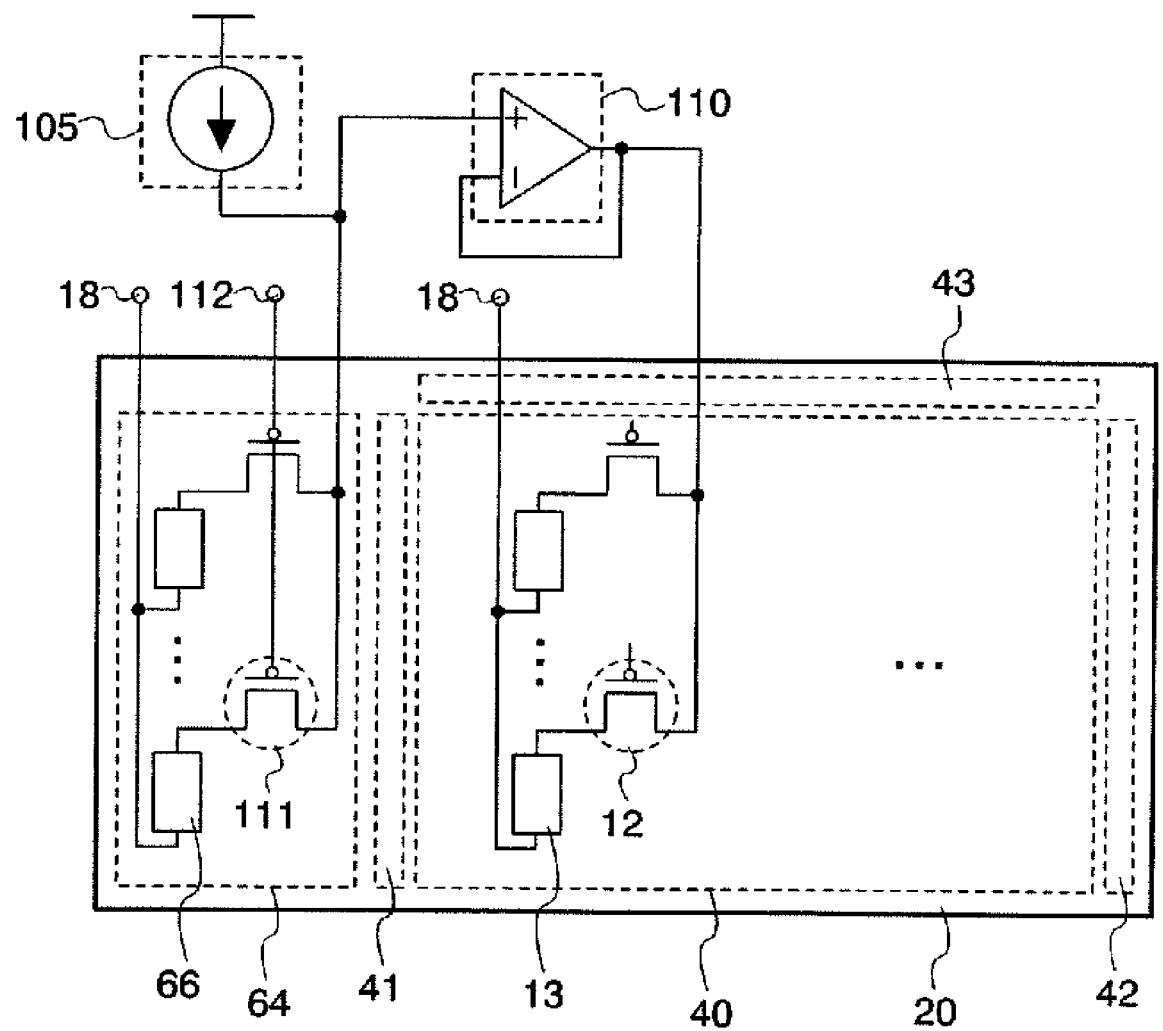
FIG. 1 is a diagram showing a configuration of a display device of the invention.

Although the invention will be fully described by way of Embodiment Modes and Embodiments with reference to the accompanying drawings, it is to be understood that various changes and modifications will be apparent to those skilled in the art. Therefore, unless such changes and modifications depart from the scope of the invention hereinafter defined, they should be construed as being included therein. Note that in the structures of the invention described below, the same components are denoted by the same reference numerals in all the drawings.

Embodiment Mode 1

A display device of the invention has a light emitting element 13 and a monitoring light emitting element 66 that are both provided over a substrate 20. The light emitting element 13 and the monitoring light emitting element 66 are formed by the same process under the same manufacturing conditions, and exhibit the same characteristics or substantially the same characteristics with respect to changes in ambient temperature and changes with time.

The display device of the invention further has a constant current source 105 and a buffer amplifier 110. These circuits may be formed over the same substrate 20 as the light emitting element 13 and the monitoring light emitting element 66, or may be formed on another substrate.

A pixel area 40 provided over the substrate 20 includes a plurality of pixels arranged in matrix. Each of the pixels has the light emitting element 13 and at least two transistors. In this embodiment mode, only a driving transistor 12 connected in series to the light emitting element 13 is shown. Drivers (a first gate driver 41, a second gate driver 42, and a source driver 43 are shown herein) are also provided over the substrate 20 and control light emission or non-light emission and luminance of each of the pixels. One of two electrodes of the light emitting element 13 is connected to an opposite power supply 18, and the other thereof is connected to an output terminal of the buffer amplifier 110 through the driving transistor 12.

One or a plurality of monitoring light emitting elements 66 are provided over the substrate 20. One of two electrodes of the monitoring light emitting element 66 is connected to the opposite power supply 18, and the other thereof is connected to an input terminal of the buffer amplifier 110 thorough a limiter transistor 111.

A monitoring circuit 64 including one or a plurality of monitoring light emitting elements 66 may be provided in the pixel area 40 or the other area. However, the monitoring circuit 64 is preferably provided in the area other than the pixel area 40 so as not to influence image display.

A constant current is supplied from the constant current source 105 to the monitoring light emitting element 66. When changes in ambient temperature and changes with time occur in this state, the resistance of the monitoring light emitting element 66 itself varies. Thus, since a constant current is supplied to the monitoring light emitting element 66, a potential difference between the two electrodes of the monitoring light emitting element 66 changes.

In the case of the aforementioned structure, the potential of one electrode of the monitoring light emitting element 66, which is connected to the opposite power supply 18, does not change, and the potential of the other electrode (referred to as a first electrode herein) of the monitoring light emitting element 66, which is connected to the constant current source 105, changes. The changed potential of the first electrode of the monitoring light emitting element 66 is supplied to the buffer amplifier 110.

The potential of one electrode of the monitoring light emitting element 66 is inputted to the input terminal of the buffer amplifier 110. A potential outputted from the output terminal of the buffer amplifier 110 is supplied to a first electrode of the light emitting element 13 through the driving transistor 12.

In the structure shown in the drawing, a inverting input terminal and the output terminal of the buffer amplifier 110 are connected to each other. The input terminal of the buffer amplifier 110 is connected to the first electrode of the monitoring light emitting element 66 while the output terminal of the buffer amplifier 110 is connected to the first electrode of the light emitting element 13.

The buffer amplifier 110 is provided in order to prevent potential variations. Accordingly, other circuits may be used instead of the buffer amplifier 110 as long as they are capable of preventing potential variations. That is, a circuit for preventing potential variations is provided between the monitoring light emitting element 66 and the light emitting element 13 when the potential of one electrode of the monitoring light emitting element 66 is transmitted to the light emitting element 13. Such a circuit is not limited to the aforementioned buffer amplifier 110 and a circuit with any configuration may be employed.

The aforementioned buffer amplifier 110 is a circuit for preventing potential variations, and can be referred to as a circuit for outputting a potential equal to an inputted potential.

A first structure of the display device of the invention is characterized by having the limiter transistor 111 connected in series to the monitoring light emitting element 66 (see FIG. 1).

A gate electrode of the limiter transistor 111 is connected to a power supply 112. The limiter transistor 111 is on, and the power supply 112 supplies a potential that turns on the limiter transistor 111. One of a source electrode and a drain electrode of the limiter transistor 111 is connected to the first electrode of the monitoring light emitting element 66, and the other thereof is connected to the input terminal of the buffer amplifier 110.

The limiter transistor 111 is provided in order to prevent an excessive current from flowing through the monitoring light emitting element 66. Even when an anode and a cathode of the monitoring light emitting element 66 are short-circuited, the limiter transistor 111 prevents the monitoring light emitting element 66 from being damaged due to an excessive current flowing through the short-circuited portion.

In order to prevent an excessive current flowing through the monitoring light emitting element 66, the channel length (L1) and the channel width (W1) of the driving transistor 12, and the channel length (L2) and the channel width (W2) of the limiter transistor 111 are preferably designed so as to satisfy L1/W1:L2/W2=1:2 to 1:10.

The driving transistor 12 or the limiter transistor 111 is not one transistor but corresponds to two transistors connected in series in some cases. In such a case, the channel length and the channel width of the driving transistor 12 or the limiter transistor 111 correspond to the total channel length and the total channel width of the two transistors connected in series, respectively.

In the structure shown in the drawing, the limiter transistor 111 is a P-channel transistor, though the invention is not limited to this and an N-channel transistor may be used as well.

In the structure shown in the drawing, the number of the monitoring light emitting elements 66 is the same as the number of the light emitting elements 13 of one column in the pixel area 40, though the number thereof is not limited to this. At least one monitoring light emitting element 66 is only required to be provided.

Figure 12:
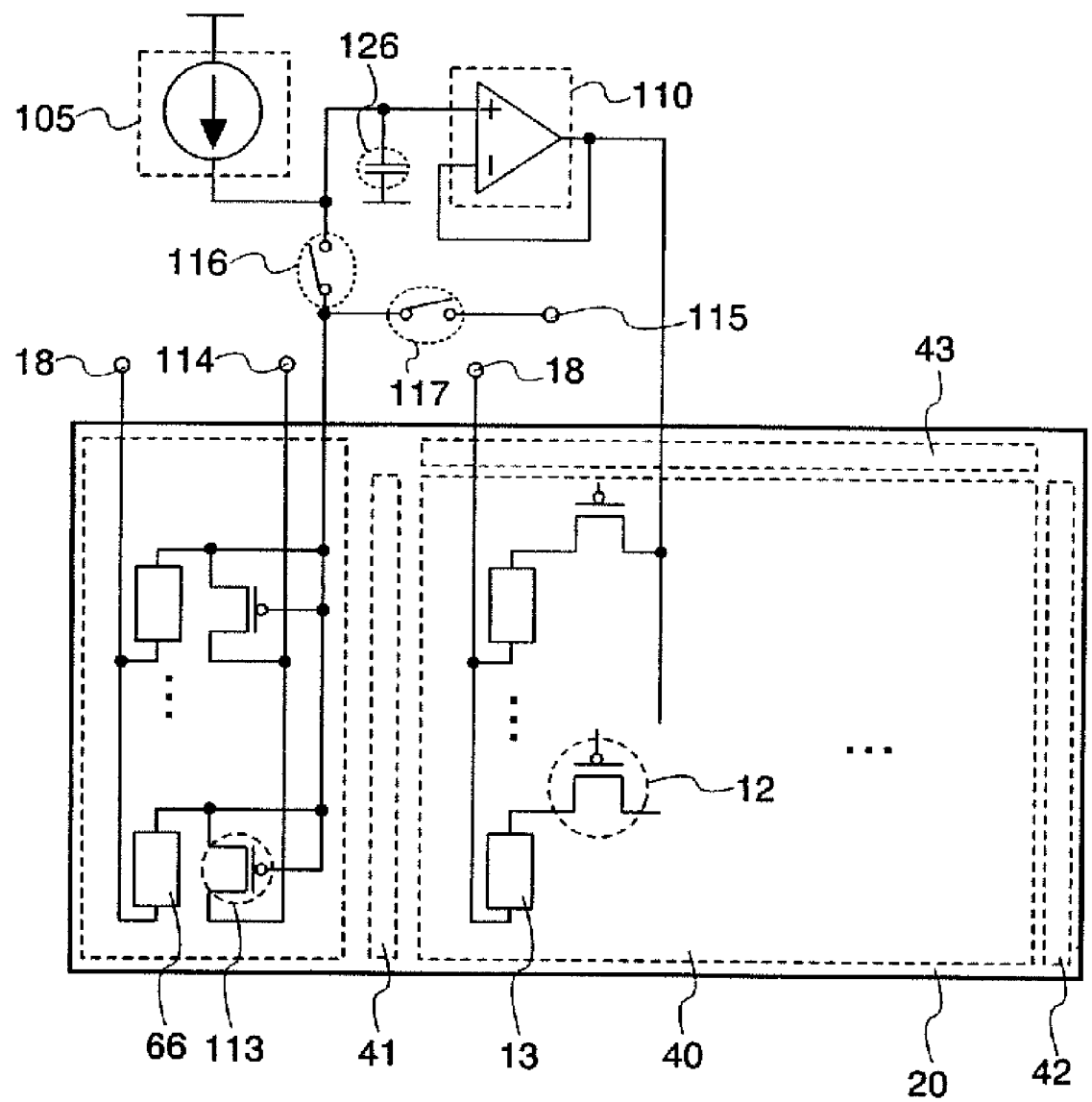
FIG. 12 is a diagram showing a configuration of a display device of the invention.

A second structure of the display device of the invention is described next with reference to FIG. 12. The second structure is characterized by having an AC transistor 113 connected in series to the monitoring light emitting element 66.

A gate electrode of the AC transistor 113 is connected to the input terminal of the buffer amplifier 110 through a switch 116. The gate electrode of the AC transistor 113 is also connected to an AC power supply 115 through a switch 117. One of a source electrode and a drain electrode of the AC transistor 113 is connected to an AC power supply 114, and the other thereof is connected to the first electrode of the monitoring light emitting element 66. The AC transistor 113 is provided in order to apply a reverse bias voltage to the monitoring light emitting element 66.

When a reverse bias voltage is applied to the monitoring light emitting element 66, the switch 116 is turned off so that the buffer amplifier 110 is not electrically connected to the monitoring light emitting element 66. In addition, the switch 117 is turned on and the potential of the AC power supply 115 is supplied to the AC transistor 113, thereby the AC transistor 113 is turned on. Then, the relative magnitude between the potential of the opposite power supply 18 and the potential of the AC power supply 114 is arbitrarily set. By applying a reverse bias voltage to the monitoring light emitting element 66, a current is locally supplied to a short-circuited portion of the anode and the cathode of the monitoring light emitting element 66, thereby the short-circuited portion can be insulated. Thus, it is possible to correct defects due to the short-circuited portion of the monitoring light emitting element 66.

A capacitor 126 is provided in order to maintain the potential of the input terminal of the buffer amplifier 110 when applying a reverse bias voltage to the monitoring light emitting element 66. However, the invention is not limited to the capacitor 126, and other circuits capable of maintaining the potential of the input terminal of the buffer amplifier 110 may be used as well.

On the other hand, when a forward bias voltage is applied to the monitoring light emitting element 66, the switch 116 is turned on while the switch 117 is turned off.

In the structure shown in the drawing, the AC transistor 113 is a P-channel transistor, though the invention is not limited to this, and an N-channel transistor may also be used. Further, although the gate electrode of the AC transistor 113 is connected to the input terminal of the buffer amplifier 110, the invention is not limited to this. A control circuit may be provided independently to control the on/off state of the AC transistor 113.

The aforementioned second structure can be freely combined with the aforementioned first structure.

Figure 13:
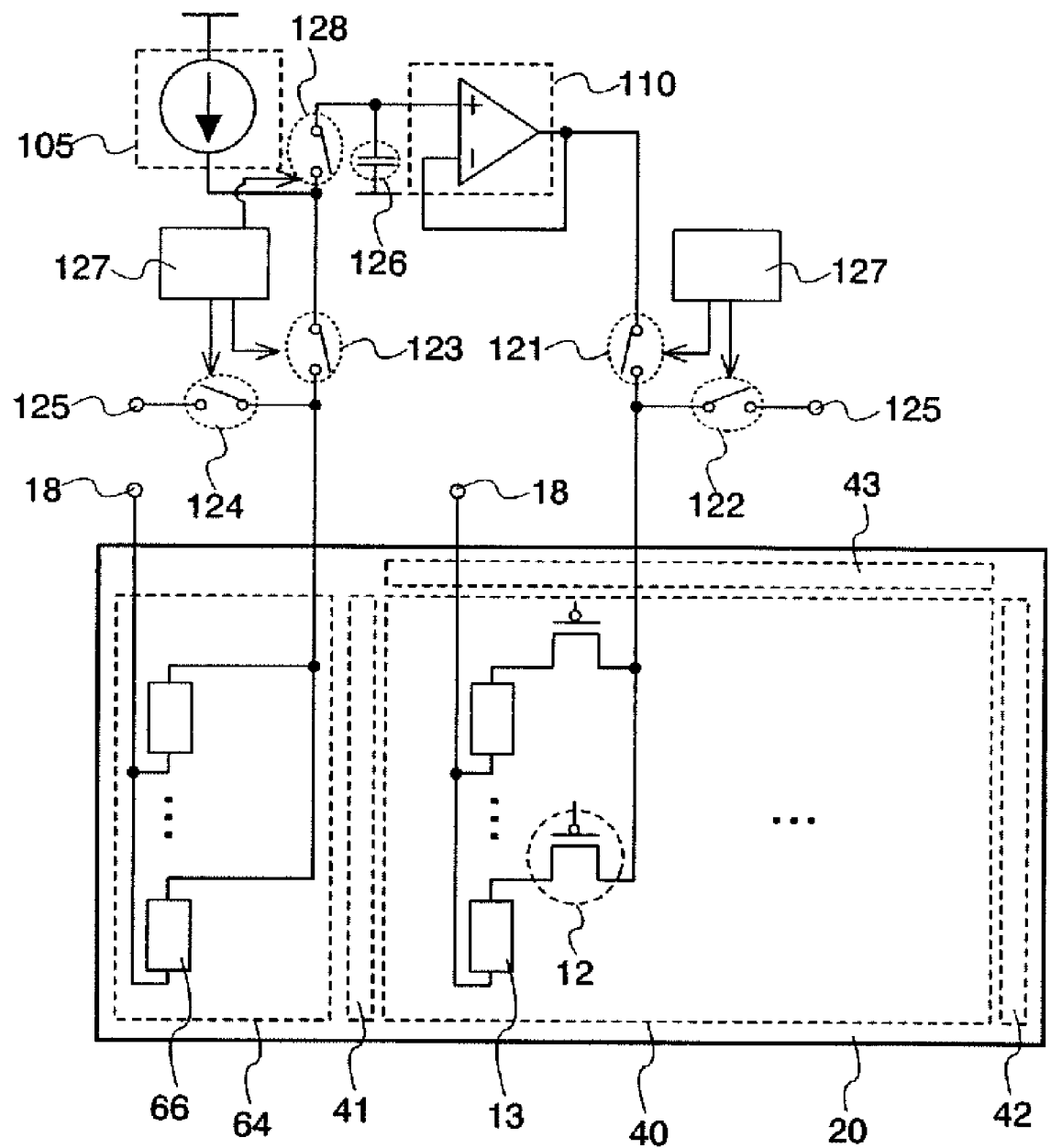
FIG. 13 is a diagram showing a configuration of a display device of the invention.

A third structure of the display device of the invention is described next with reference to FIG. 13. The third structure is characterized by having the capacitor 126 connected to the input terminal of the buffer amplifier 110, a first switch 121 provided between the first electrode of the light emitting element 13 and the output terminal of the buffer amplifier 110, a second switch 122 provided between the first electrode of the light emitting element 13 and an AC power supply 125, a third switch 123 provided between the first electrode of the monitoring light emitting element 66 and the input terminal of the buffer amplifier 110, a fourth switch 124 provided between the first electrode of the monitoring light emitting element 66 and the AC power supply 125, and a fifth switch 128 provided between the constant current source 105 and the input terminal of the buffer amplifier 110. For the first switch 121, the second switch 122, the third switch 123, the fourth switch 124, and the fifth switch 128, a known element having a switching function, such as a transistor may be employed.

When a reverse bias voltage is applied to the light emitting element 13 and the monitoring light emitting element 66, a control circuit 127 brings the first switch 121, the third switch 123, and the fifth switch 128 into a non-conductive state whereas the second switch 122 and the fourth switch 124 into a conductive state. Then, the relative magnitude between the potential of the opposite power supply 18 and the potential of the AC power supply 125 is arbitrarily set. As set forth above, by applying a reverse bias voltage to the light emitting element 13 and the monitoring light emitting element 66, a short-circuited portion can be insulated and defects due to the short-circuited portion can be corrected.

On the other hand, when a forward bias voltage is applied to the light emitting element 13 and the monitoring light emitting element 66, the control circuit 127 brings the first switch 121, the third switch 123, and the fifth switch 128 into a conductive state whereas the second switch 122 and the fourth switch 124 into a non-conductive state.

The capacitor 126 is provided in order to maintain the potential of the input terminal of the buffer amplifier 110 when applying a reverse bias voltage to the light emitting element 13 and the monitoring light emitting element 66. However, the invention is not limited to the capacitor 126, and other circuits capable of maintaining the potential of the input terminal of the buffer amplifier 110 may be used as well.

The aforementioned third structure can be freely combined with one or both of the aforementioned first and second structures.

Figure 14:
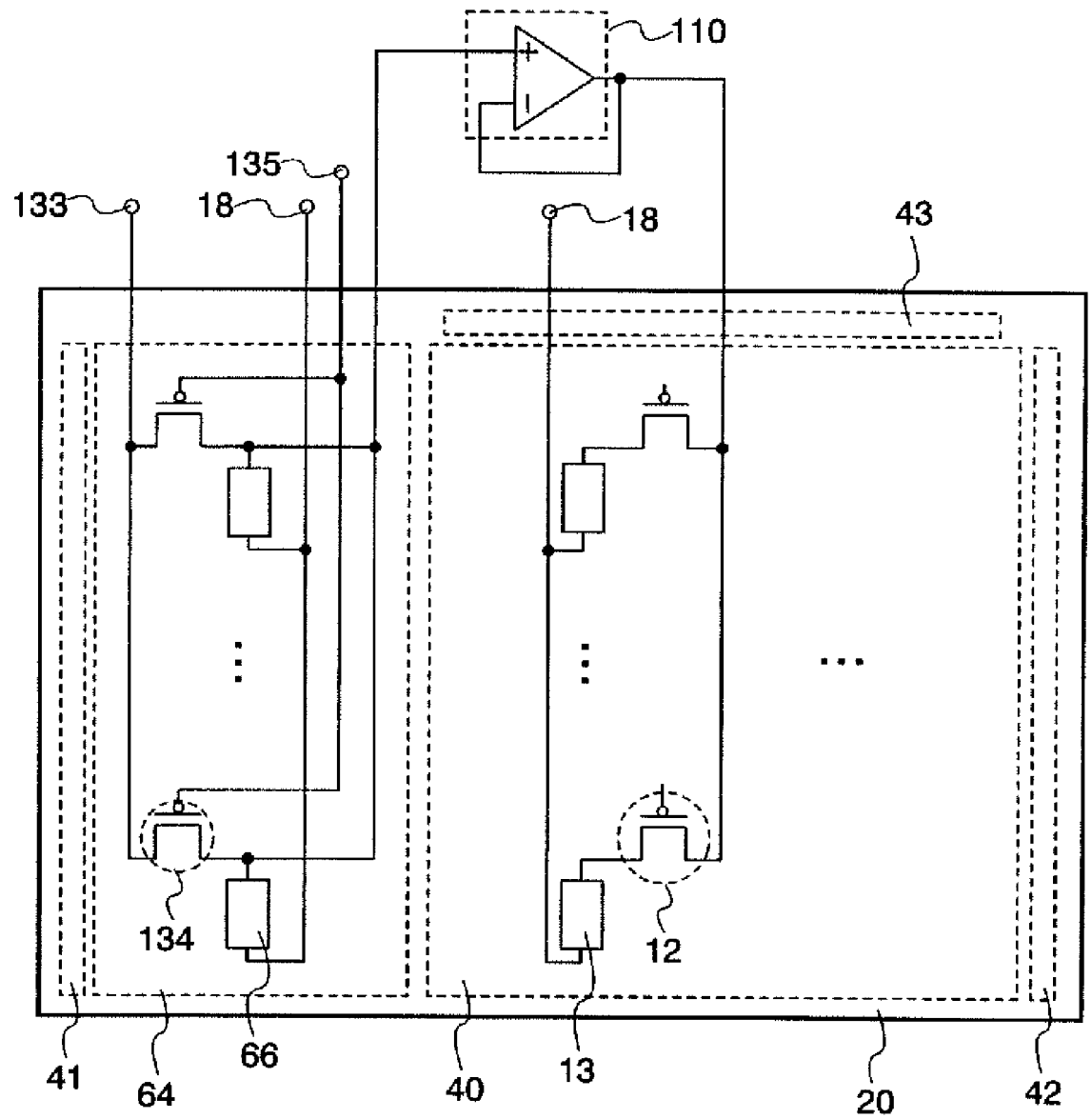
FIG. 14 is a diagram showing a configuration of a display device of the invention.

A fourth structure of the display device of the invention is described next with reference to FIG. 14. The fourth structure is characterized by having a current source transistor 134 instead of the constant current source 105.

The current source transistor 134 is connected in series to the monitoring light emitting element 66, and a gate electrode thereof is connected to a power supply 135. One of a source electrode and a drain electrode of the current source transistor 134 is connected to the first electrode of the monitoring light emitting element 66 and the other thereof is connected to a power supply 133.

The current source transistor 134 operates in a saturation region in order to be used as a current source. Accordingly, the potentials of the power supplies 133 and 135 are arbitrarily set to adjust a gate-source voltage of the current source transistor 134. In order to operate the current source transistor 134 in a saturation region, the ratio of the channel length L to the channel width W (L/W) of the current source transistor 134 is preferably set to 2 to 100.

In the structure shown in the drawing, the current source transistor 134 is a P-channel transistor, though the invention is not limited to this and an N-channel transistor may be used as well.

The aforementioned fourth structure can be freely combined with one or more of the aforementioned first to third structures.

Figure 15:
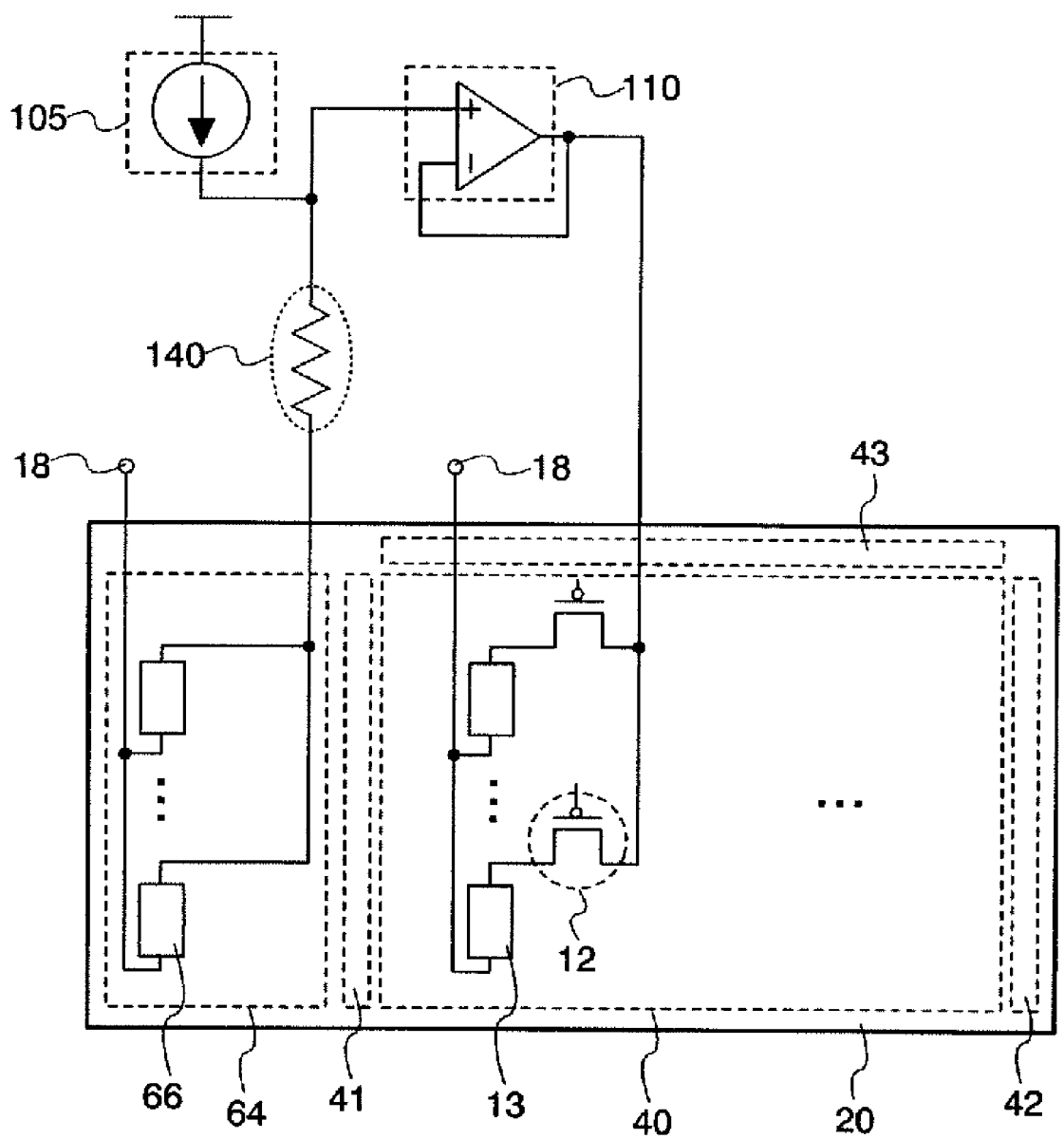
FIG. 15 is a diagram showing a configuration of a display device of the invention.

A fifth structure of the display device of the invention is described next with reference to FIG. 15. The fifth structure is characterized by having a resistor 140 provided between the input terminal of the buffer amplifier 110 and the monitoring light emitting element 66. The resistor 140 may be either a variable resistor or a fixed resistor.

The resistor 140 is provided in order to adjust a difference between the total amount of current of the monitoring light emitting element 66 and the total amount of current of the light emitting element 13 during a certain period (e.g., during one frame period).

If the monitoring light emitting element 66 operates normally using the constant current source 105, the duty ratio of the monitoring light emitting element 66 is 100%. Meanwhile, the duty ratio of the light emitting element 13 is about 70% even when a white image is displayed on the entire screen, and it is less than 70% if the lighting ratio is taken into consideration. In other words, in normal operation, changes with time of the monitoring light emitting element 66 progress more rapidly than changes with time of the light emitting element 13.

Therefore, according to the fifth structure, the resistor 140 is provided to make the current value of the monitoring light emitting element 66 lower than that of the light emitting element 13 at a certain moment, thereby the total amount of current during a certain period is made the same in both of the monitoring light emitting element 66 and the light emitting element 13. As a result, changes with time progress at the same rate, and a power supply potential can be corrected more accurately in view of the changes with time.

The aforementioned fifth structure can be freely combined with one or more of the aforementioned first to fourth structures.

A sixth structure of the display device of the invention is described next with reference to FIG. 17. The sixth structure is characterized by having a forward bias transistor 132 connected in series to the monitoring light emitting element 66. A gate electrode of the forward bias transistor 132 is connected to a gate line of the same row as a switching transistor 11 included in a pixel 10. One of a source electrode and a drain electrode of the forward bias transistor 132 is connected to the first electrode of the monitoring light emitting element 66, and the other thereof is connected to a forward bias power supply 131. The forward bias transistor 132 is provided in order to apply a forward bias voltage to the monitoring light emitting element 66.

When a forward bias voltage is applied to the monitoring light emitting element 66, the forward bias transistor 132 is turned on, and the relative magnitude of the potential of the opposite power supply 18 and the potential of the forward bias power supply 131 is arbitrarily set.

By applying a forward bias voltage to the monitoring light emitting element 66, a current is locally supplied to a short-circuited portion of the monitoring light emitting element 66, thereby the short-circuited portion can be insulated. Thus, it is possible to correct defects due to the short-circuited portion of the monitoring light emitting element 66.

In the aforementioned structure, the limiter transistor 111 is provided in addition to the forward bias transistor 132. The aforementioned sixth structure can be freely combined with one or more of the aforementioned first to fifth structures.

According to one or more of the aforementioned first to sixth structures, a power supply potential can be corrected in accordance with changes in ambient temperature and changes with time. In addition, according to the invention, the correction can be performed without user operation. Thus, the correction can be continued after a device is supplied to an end user, which is expected to result in longer life of the device.

In the case of color display, electroluminescent layers with different emission wavelengths may be formed in each pixel, and typically, electroluminescent layers corresponding to each color of red (R), green (G), and blue (B) are formed in each pixel. In such a case, at least the monitoring light emitting element 66, the constant current source 105, and the buffer amplifier 110 corresponding to each color of red, green, and blue are provided, and a power supply potential may be corrected in accordance with each color.

Embodiment Mode 2

An example of a structure of the display device of the invention is described with reference to drawings. The display device of the invention has a plurality of pixels 10 each including a plurality of elements, which are provided in an area where a source line Sx (x is a natural number, 1=x=m) and a gate line Gy (y is a natural number, 1=y=n) cross each other with an insulator interposed therebetween (see FIG. 2A). The pixel 10 has the light emitting element 13, a capacitor 16, and two transistors. One of the two transistors is the switching transistor 11 for controlling video signal input to the pixel 10, and the other is the driving transistor 12 for controlling light emission or non-light emission of the light emitting element 13. The switching transistor 11 and the driving transistor 12 are field effect transistors, and each has three terminals of a gate electrode, a source electrode, and a drain electrode.

A gate electrode of the switching transistor 11 is connected to the gate line Gy, one of a source electrode and a drain electrode thereof is connected to the source line Sx, and the other is connected to a gate electrode of the driving transistor 12. One of a source electrode and a drain electrode of the driving transistor 12 is connected to a power supply line Vx (x is a natural number, 1=x=m), and the other is connected to a pixel electrode of the light emitting element 13. An opposite electrode of the light emitting element 13 is connected to the opposite power supply 18. The capacitor 16 is provided between the gate electrode and the source electrode of the driving transistor 12.

The conductivity of the switching transistor 11 and the driving transistor 12 is not limited, and both of an N-channel transistor and a P-channel transistor may be used. In the structure shown in the drawing, the switching transistor 11 is an N-channel transistor while the driving transistor 12 is a P-channel transistor. The potential of the power supply line Vx and the potential of the opposite power supply 18 are not limited either, though different potentials are applied to the power supply line Vx and the opposite power supply 18 so as to apply a forward bias voltage or a reverse bias voltage to the light emitting element 13.

The display device of the invention having the aforementioned structure is characterized by having two transistors in the pixel 10. According to the aforementioned structure, the number of transistors laid out in each pixel 10 can be reduced. A smaller number of transistors laid out in each pixel 10 naturally reduces the number of wirings to be disposed, leading to a high aperture ratio, high definition, and high yield. When the high aperture ratio is achieved, the luminance of the light emitting element can be reduced with the increase in light emitting area. That is, the current density of the light emitting element can be reduced. Accordingly, driving voltage can be reduced, which results in lower power consumption. In addition, the reliability of the light emitting element 13 can be improved with a lower driving voltage.

The display device of the invention is characterized in that the driving transistor 12 operates in a linear region. According to this, the driving voltage of the light emitting element 13 can be made lower than in the case where the driving transistor operates in a saturation region, leading to lower power consumption.

A semiconductor included in the switching transistor 11 and the driving transistor 12 may be formed using any of an amorphous semiconductor (amorphous silicon), a microcrystalline semiconductor, a polycrystalline semiconductor (polysilicon), and an organic semiconductor. The microcrystalline semiconductor may be formed by using silane gas ($SiH_4$) and fluorine gas ($F_2$), or silane gas and hydrogen gas, or by laser irradiation after the formation of a thin film using the aforementioned gases.

The respective gate electrodes of the switching transistor 11 and the driving transistor 12 are formed as a single layer or stacked layers using a conductive material. For example, it is preferable to adopt a stacked structure of tungsten (W) and tungsten nitride (WN), a stacked structure of molybdenum (Mo), aluminum (Al), and molybdenum (Mo), or a stacked structure of molybdenum (Mo) and molybdenum nitride (MoN).

Conductive layers (source and drain wirings) connected to impurity regions (source electrode and drain electrode) of the switching transistor 11 and the driving transistor 12 are formed as a single layer or stacked layers using a conductive material. For example, it is preferable to adopt a stacked structure of titanium (Ti), aluminum silicon (Al—Si), and titanium (Ti), a stacked structure of molybdenum (Mo), aluminum silicon (Al—Si), and molybdenum (Mo), or a stacked structure of molybdenum nitride (MoN), aluminum silicon (Al—Si), and molybdenum nitride (MoN). Alternatively, an aluminum-based material containing nickel or an aluminum-based alloy containing nickel and one or both of carbon and silicon may be used as well.

Figure 2B:
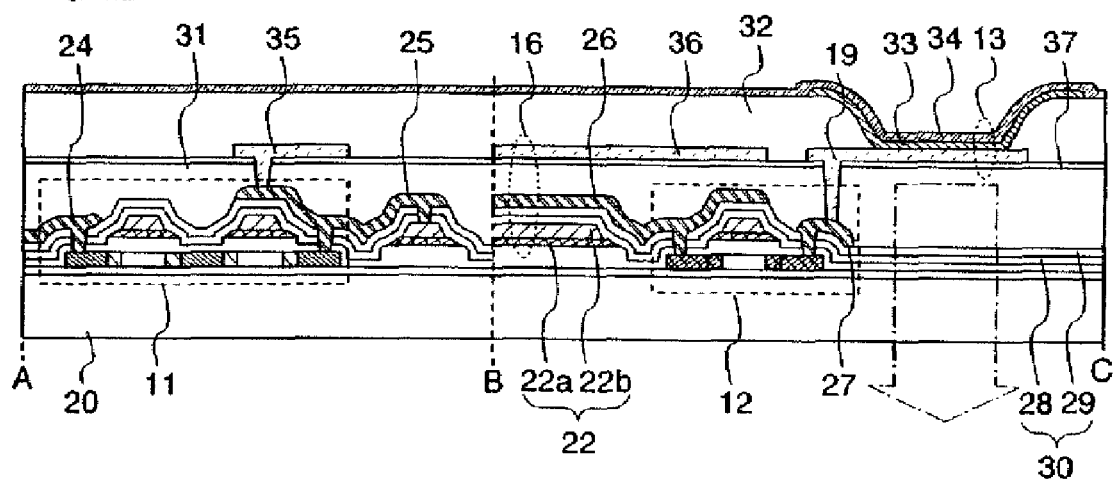
Figure 3:
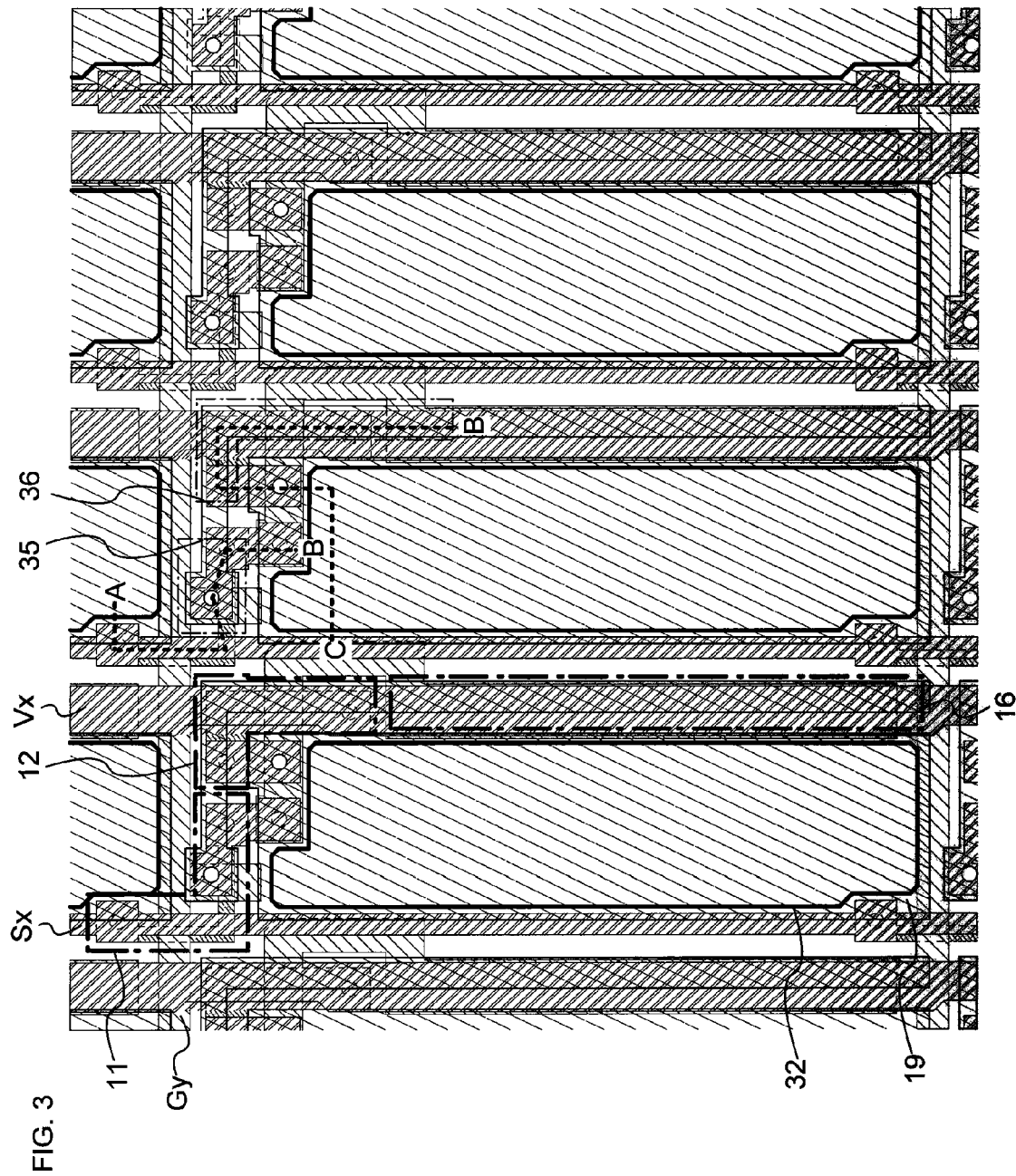
FIG. 3 is a diagram showing a layout of a display device of the invention.

FIG. 3 shows a layout of the pixel 10 having the aforementioned structure. Shown in this layout are the switching transistor 11, the driving transistor 12, the capacitor 16, and a conductive layer 19 corresponding to the pixel electrode of the light emitting element 13. FIG. 2B shows a cross sectional structure along a line A-B-C of this layout. The switching transistor 11, the driving transistor 12, the light emitting element 13, and the capacitor 16 are provided over the substrate 20 having an insulating surface such as glass and quartz.

The light emitting layer 13 has a stacked structure of the conductive layer 19 corresponding to the pixel electrode, an electroluminescent layer 33, and a conductive layer 34 corresponding to the opposite electrode. If both of the conductive layers 19 and 34 transmit light, the light emitting element 13 emits light in the directions of the conductive layer 19 and the conductive layer 34 (dual emission). Meanwhile, if one of the conductive layers 19 and 34 transmits light and the other blocks light, the light emitting element 13 emits light only in the direction of the conductive layer 19 or the direction of the conductive layer 34 (top emission or bottom emission). FIG. 2B shows a cross sectional structure in the case where the light emitting element 13 performs the bottom emission.

The capacitor 16 is provided between the gate electrode and the source electrode of the driving transistor 12, and holds a gate-source voltage of the driving transistor 12. The capacitor 16 is constituted by conductive layers 22a and 22b (hereinafter collectively referred to as a conductive layer 22) formed on the same layer as the gate electrodes of the switching transistor 11 and the driving transistor 12, a conductive layer 26 corresponding to the source and drain wirings of the driving transistor 12, and an insulating layer between the conductive layer 22 and the conductive layer 26.

The capacitor 16 is also constituted by the conductive layer 26 corresponding to the source and drain wirings of the driving transistor 12, a conductive layer 36 formed on the same layer as the pixel electrode of the light emitting element 13, and an insulating layer between the conductive layer 26 and the conductive layer 36. As shown in the layout of FIG. 3, the conductive layer 35 is connected to the conductive layer 36.

According to the aforementioned structure, the capacitor 16 can obtain capacitance large enough to hold the gate-source voltage of the driving transistor 12. The capacitor 16 is provided under a conductive layer constituting the power supply line, therefore, decrease in aperture ratio due to the capacitor 16 can be prevented. In addition, since the gate insulating film of the switching transistor 11 and the driving transistor 12 is not used for the capacitor 16, gate leak current can be reduced, leading to lower power consumption.

The respective thicknesses of the conductive layers 24 to 27 corresponding to the source and drain wirings of the switching transistor 11 and the driving transistor 12 are 500 to 2000 nm, and preferably 500 to 1300 nm. When the respective thicknesses of the conductive layers 24 to 27 increase in this manner, the influence of voltage drop can be suppressed since the source line Sx and the power supply line Vx are constituted by the conductive layers 24 to 27. Note that increased thickness of the conductive layers 24 to 27 reduces wiring resistance, while too much increased thickness of the conductive layers 24 to 27 results in difficulty in patterning with accuracy and making an even surface. In other words, the respective thicknesses of the conductive layers 24 to 27 may be determined within the aforementioned range taking into consideration the influences of wiring resistance, difficulty in patterning, and unevenness of the surface.

The display device of the invention is also characterized by having insulating layers 28 and 29 (hereinafter collectively referred to as a first insulating layer 30) covering the switching transistor 11 and the driving transistor 12, and a second insulating layer 31 formed over the first insulating layer 30. The conductive layer 19 corresponding to the pixel electrode is formed over the second insulating layer 31. If the second insulating layer 31 is not provided, the conductive layers 24 to 27 corresponding to the source and drain wirings are formed on the same layer as the conductive layer 19, and thus, an area for forming the conductive layer 19 is limited to an area other than the conductive layers 24 to 27. Meanwhile, when the second insulating layer 31 is provided, an area occupied by the conductive layer 19 increases, leading to a high aperture ratio. This structure is effective, particularly for the top emission. The high aperture ratio increases a light emitting area, which results in lower driving voltage and power consumption.

The first insulating layer 30 and the second insulating layer 31 are made of an inorganic material such as silicon oxide and silicon nitride, or an organic material such as polyimide and acrylic. The first insulating layer 30 and the second insulating layer 31 may be made of the same material or different materials. As the insulating layer material, a siloxane-based material or a material including siloxane may be used, which is, for example, composed of a skeleton formed by the bond of silicon (Si) and oxygen (O). The siloxane-based material includes an organic group containing at least hydrogen (such as an alkyl group or aromatic hydrocarbon) as a substituent. Alternatively, a fluoro group may be used as the substituent. Further alternatively, a fluoro group and an organic group containing at least hydrogen may be used as the substituent.

The second insulating layer 31 may be formed of an organic material capable of making some thickness to reduce the unevenness of the bottom layer. If the second insulating layer 31 is made of an organic material, it is preferable that a third insulating layer 37 be made of nitride functioning as a barrier film (specifically, silicon nitride) in order to prevent degasification.

A bank layer (also called an insulating layer) 32 may be formed of either an organic material or an inorganic material. However, since an electroluminescent layer of the light emitting element 13 is provided so as to be in contact with the bank layer 32, the bank layer 32 preferably has a shape with a radius of curvature changing continuously such that pinholes and the like are not formed in the electroluminescent layer. In addition, the bank layer 32 is preferably formed of a material that blocks light, thereby boundaries between pixels are defined.

Figure 4:
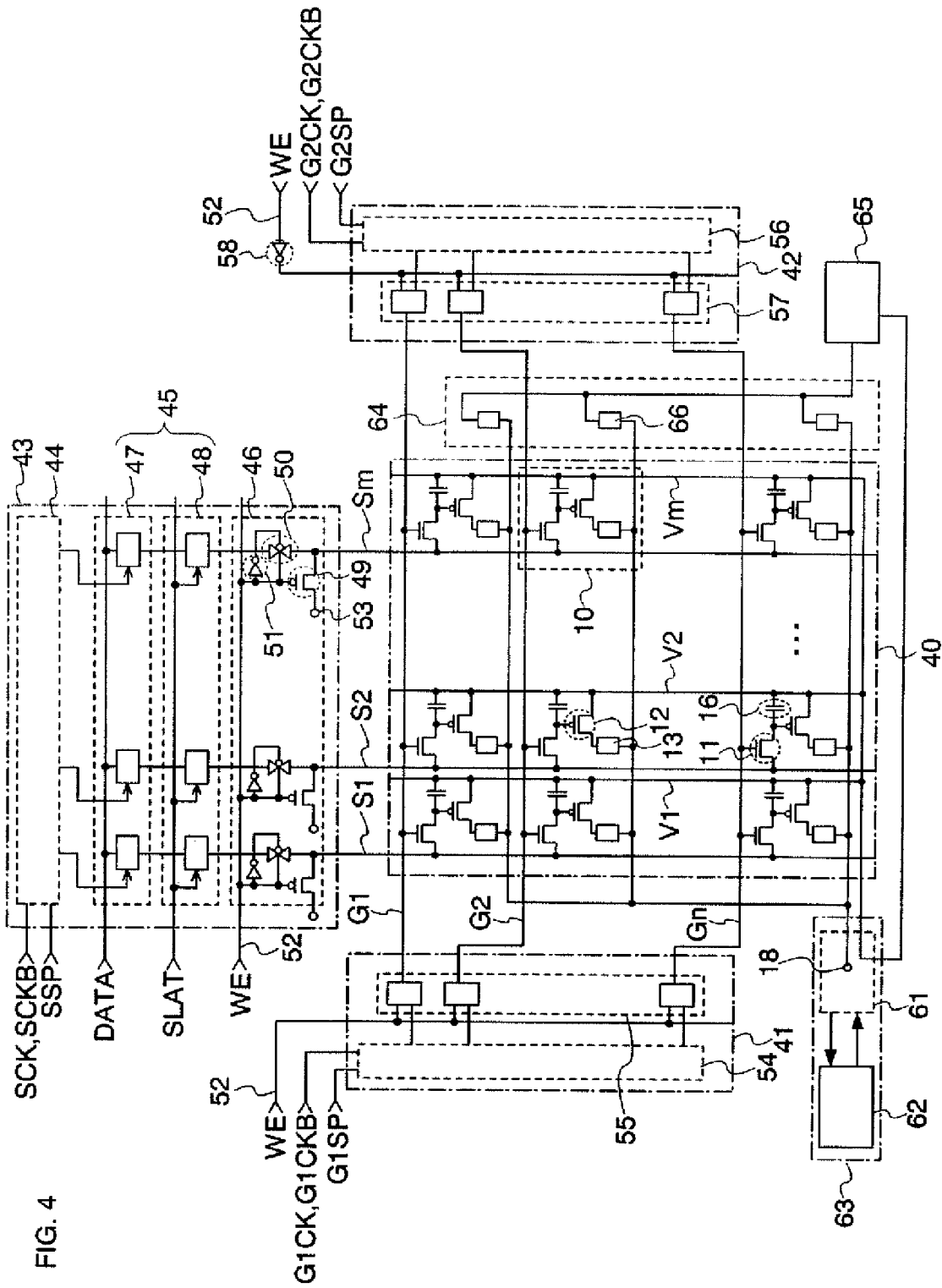
FIG. 4 is a diagram showing a configuration of a display device of the invention.

The display device of the invention also has the pixel area 40 where a plurality of the aforementioned pixels 10 are arranged in matrix, the first gate driver 41, the second gate driver 42, and the source driver 43 (see FIG. 4). The first gate driver 41 and the second gate driver 42 are disposed so as to face each other with the pixel area 40 interposed therebetween, or disposed on one of the four sides of the pixel area 40.

The source driver 43 has a pulse output circuit 44, a latch 45, and a selection circuit 46. The latch 45 includes a first latch 47 and a second latch 48. The selection circuit 46 includes a transistor 49 and an analog switch 50. The transistor 49 and the analog switch 50 are provided for each column corresponding to the source line Sx. The inverter 51 generates an inverted signal of a WE (Write Erase) signal, and it is not necessarily provided if an inverted signal of a WE signal is supplied externally.

A gate electrode of the transistor 49 is connected to a selection signal line 52, one of a source electrode and a drain electrode is connected to the source line Sx, and the other is connected to a power supply 53. The analog switch 50 is provided between the second latch 48 and the source line Sx. In other words, an input node of the analog switch 50 is connected to the second latch 48 while an output node thereof is connected to the source line Sx. One of two control nodes of the analog switch 50 is connected to the selection signal line 52 while the other is connected to the selection signal line 52 through the inverter 51. The potential of the power supply 53 turns off the driving transistor 12 included in the pixel 10. The potential of the power supply 53 is set to L level if the driving transistor 12 is an N-channel transistor, whereas the potential of the power supply 53 is set to H level if the driving transistor 12 is a P-channel transistor.

The first gate driver 41 has a pulse output circuit 54 and a selection circuit 55. The second gate driver 42 has a pulse output circuit 56 and a selection circuit 57. The selection circuits 55 and 57 are connected to the respective selection signal lines 52, though the selection circuit 57 included in the second gate driver 42 is connected to the selection signal line 52 through an inverter 58. That is, inverted WE signals are inputted to the selection circuits 55 and 57 through the respective selection signal lines 52.

Each of the selection circuits 55 and 57 has a tri-state buffer. An input node of the tri-state buffer is connected to the pulse output circuit 54 or the pulse output circuit 56, and a control node thereof is connected to the selection signal line 52. An output node of the tri-state buffer is connected to the gate line Gy. The tri-state buffer is brought into an operating state when a signal transmitted from the selection signal line 52 is H level while into a floating state when a signal transmitted from the selection signal line 52 is L level.

The pulse output circuit 44 included in the source driver 43, the pulse output circuit 54 in the first gate driver 41, and the pulse output circuit 56 in the second gate driver 42 correspond to a shift register constituted by a plurality of flip flop circuits or a decoder circuit. If a decoder circuit is used as the pulse output circuits 44, 54, and 56, the source line Sx or the gate line Gy can be selected at random. When the source line Sx or the gate line Gy can be selected at random, it is possible to suppress pseudo contour generated in the case of adopting a time gray scale method.

The configuration of the source driver 43 is not limited to the foregoing, and a level shifter and a buffer may be provided additionally. The configurations of the first gate driver 41 and the second gate driver 42 are also not limited to the foregoing, and a level shifter or a buffer may be provided additionally. Moreover, the source driver 43, the first gate driver 41, and the second gate driver 42 may include a protection circuit.

The display device of the invention is also characterized by having a power supply control circuit 63. The power supply control circuit 63 has a power supply circuit 61 for supplying power to the light emitting element 13, and a control circuit 62. The power supply circuit 61 is connected to the pixel electrode of the light emitting element 13 through the driving transistor 12 and the power supply line Vx. The opposite power supply 18 included in the power supply circuit 61 is connected to the opposite electrode of the light emitting element 13 through the power supply line Vx.

When a forward bias voltage is applied to the light emitting element 13 to supply a current thereto and emit light, the potential difference between the power supply line Vx and the opposite power supply 18 is set such that the potential of the power supply line Vx is higher than that of the opposite power supply 18. Meanwhile, when a reverse bias voltage is applied to the light emitting element 13, the potential difference between the power supply line Vx and the opposite power supply 18 is set such that the potential of the power supply line Vx is lower than that of the opposite power supply 18. Such a power supply setting is made by supplying a predetermined signal from the control circuit 62 to the power supply circuit 61.

According to the invention, a reverse bias voltage is applied to the light emitting element 13 by using the power supply control circuit 63, thereby degradation with time of the light emitting element 13 can be suppressed and reliability can be improved. In the light emitting element 13, an initial defect where an anode and a cathode are short-circuited may occur due to the deposition of foreign material, pinholes due to a slight unevenness of the anode or the cathode, and unevenness of the electroluminescent layer. In a pixel having such an initial defect, problems occur such that light emission and non-light emission are not carried out in accordance with signals, and thus almost all currents flow through the short-circuited portion and the whole element emits no light, or certain pixels do not correctly emit light or no light, leading to faulty display of images. However, since a reverse bias voltage can be applied to the light emitting element according to the invention, a current is locally supplied only to a short-circuited portion between the anode and the cathode, and the short-circuited portion generates heat. As a result, the short-circuited portion can be oxidized or carbonized to be insulated. Thus, even when an initial defect occurs, the defect can be corrected and images can be displayed with high quality. Note that such insulation of the initial defect is preferably performed before shipment of the display device. In addition to the initial defect, a defect where the anode and the cathode are short-circuited may occur as time passes. Such a defect is also called a progressive defect. However, according to the invention, a reverse bias voltage can be applied to the light emitting element periodically. Therefore, even when a progressive defect occurs, the defect can be corrected and images can be displayed with high quality. Note that a reverse bias voltage can be applied to the light emitting element 13 at any timing.

As set forth above, the display device of the invention is also characterized by having the monitoring circuit 64 including the monitoring light emitting element 66, and a monitor control circuit 65 including the constant current source, the buffer amplifier and the like. The specific configurations of the monitoring circuit 64 and the monitor control circuit 65 are described in Embodiment Mode 1, therefore, the description thereof is omitted herein. According to the invention having the aforementioned structures, variations in current values of the light emitting element due to changes in ambient temperature and changes with time can be suppressed, leading to improved reliability.

Figure 17:
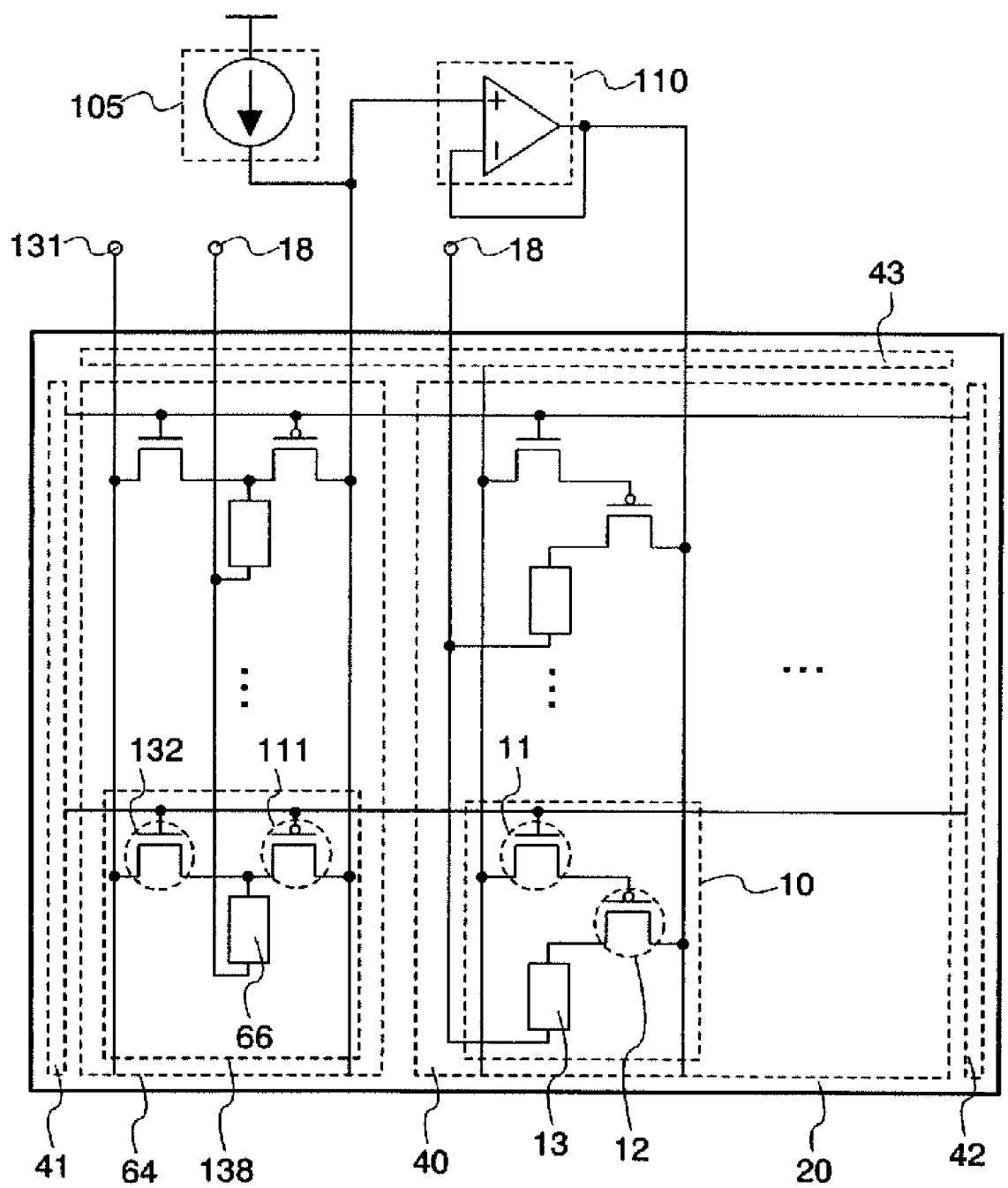
FIG. 17 is a diagram showing a configuration of a display device of the invention.

Note that in the structures shown in FIGS. 1 and 17, the monitor control circuit 65 includes the constant current source 105 and the buffer amplifier 110. In the structure shown in FIG. 12, the monitor control circuit 65 includes the constant current source 105, the buffer amplifier 110, the switches 116 and 117, and the capacitor 126. In the structure shown in FIG. 13, the monitor control circuit 65 includes the constant current source 105, the buffer amplifier 110, the first switch 121, the second switch 122, the third switch 123, the fourth switch 124, the capacitor 126, the control circuit 127, and the fifth switch 128. In the structure shown in FIG. 14, the monitor control circuit 65 includes the buffer amplifier 110. In the structure shown in FIG. 15, the monitor control circuit 65 includes the constant current source 105, the buffer amplifier 110, and the resistor 140.

Figure 5A:
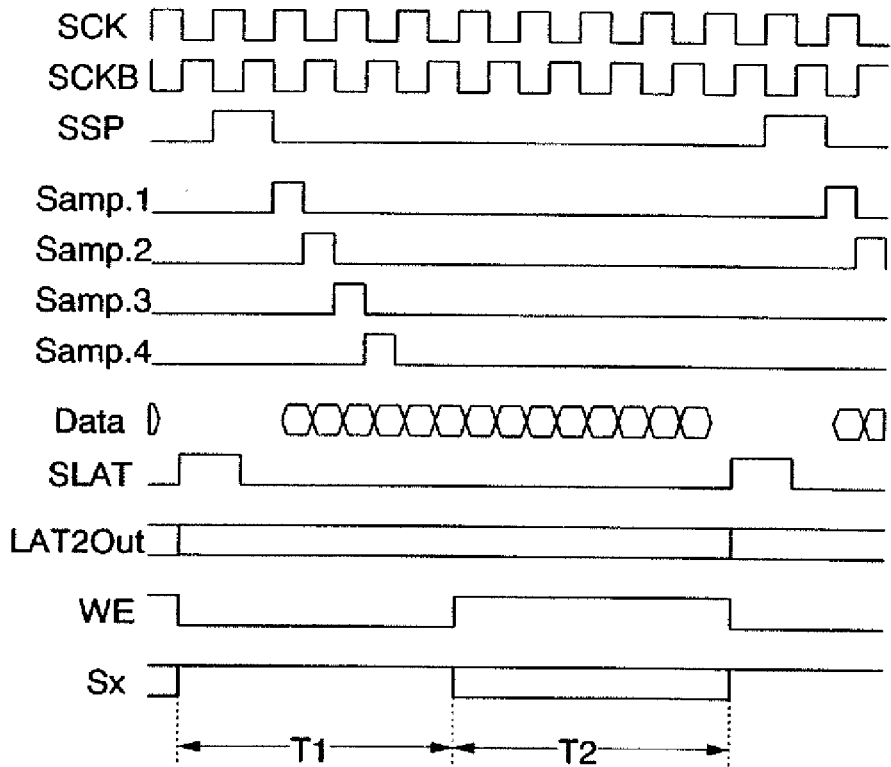
FIGS. 5A and 5B are timing charts each showing operation of a display device of the invention.

Operation of the display device of the invention having the aforementioned structures is described next with reference to drawings. First, operation of the source driver is described with reference to FIG. 5A. A clock signal (hereinafter referred to as SCK), a clock inverted signal (hereinafter referred to as SCKB), and a start pulse (hereinafter referred as SSP) are inputted to the pulse output circuit 44, and a sampling pulse is outputted to the first latch 47 at the timing of these signals. The first latch 47 to which data is inputted holds video signals of the first to last columns at the timing of the inputted sampling pulse. When a latch pulse is inputted to the second latch 48, the video signals held in the first latch 47 are simultaneously transmitted to the second latch 48.

When it is assumed that an L level WE signal is transmitted from the selection signal line 52 during a period T1 while an H level WE signal is transmitted during a period T2, the selection circuit 46 operates during each period in the following manner. Each of the periods T1 and T2 corresponds to half of a horizontal scan period, and the period T1 is called a first subgate selection period whereas the period T2 is called a second subgate selection period.

During the period T1 (first subgate selection period), an L level WE signal is transmitted from the selection signal line 52, the transistor 49 is turned on, and the analog switch 50 is brought into a non-conductive state. Then, the plurality of signal lines S1 to Sn are electrically connected to the power supply 53 through the transistor 49 provided in each column. That is, the potentials of the signal lines S1 to Sn become equal to the potential of the power supply 53.

At this time, the switching transistor 11 included in the pixel 10 is on, and the potential of the power supply 53 is transmitted to the gate electrode of the driving transistor 12 through the switching transistor 11. Thus, the driving transistor 12 is turned off and the two electrodes of the light emitting element 13 have the same potential. That is, no current flows through the two electrodes of the light emitting element 13, thereby no light is emitted. In this manner, the potential of the power supply 53 is transmitted to the gate electrode of the driving transistor 12 regardless of the state of a video signal inputted to a video line, and thus the driving transistor 12 is turned off and the two electrodes of the light emitting element 13 have the same potential. Such operation is called erasing operation.

During the period T2 (second subgate selection period), an H level WE signal is transmitted from the selection signal line 52, the transistor 49 is turned off, and the analog switch 50 is brought into a conductive state. Then, the video signals held in the second latch 48 are simultaneously transmitted to the signal lines S1 to Sn for one row. At this time, the switching transistor 11 included in the pixel 10 is on, and the video signal is transmitted to the gate electrode of the driving transistor 12 through the switching transistor 11. Thus, the driving transistor 12 is turned on or off depending on the inputted video signal, thereby the two electrodes of the light emitting element 13 have different potentials or the same potential. More specifically, when the driving transistor 12 is turned on, the two electrodes of the light emitting element 13 have different potentials and a current flows therethrough, namely, the light emitting element 13 emits light. Note that the same current flows through the light emitting element 13 and between the source and the drain of the driving transistor 12.

On the other hand, when the driving transistor 12 is turned off, the two electrodes of the light emitting element 13 have the same potential and no current flows therethrough, namely, the light emitting element 13 emits no light. In this manner, the driving transistor 12 is turned on or off depending on a video signal, and the two electrodes of the light emitting element 13 have different potentials or the same potential. Such operation is called writing operation.

Figure 5B:
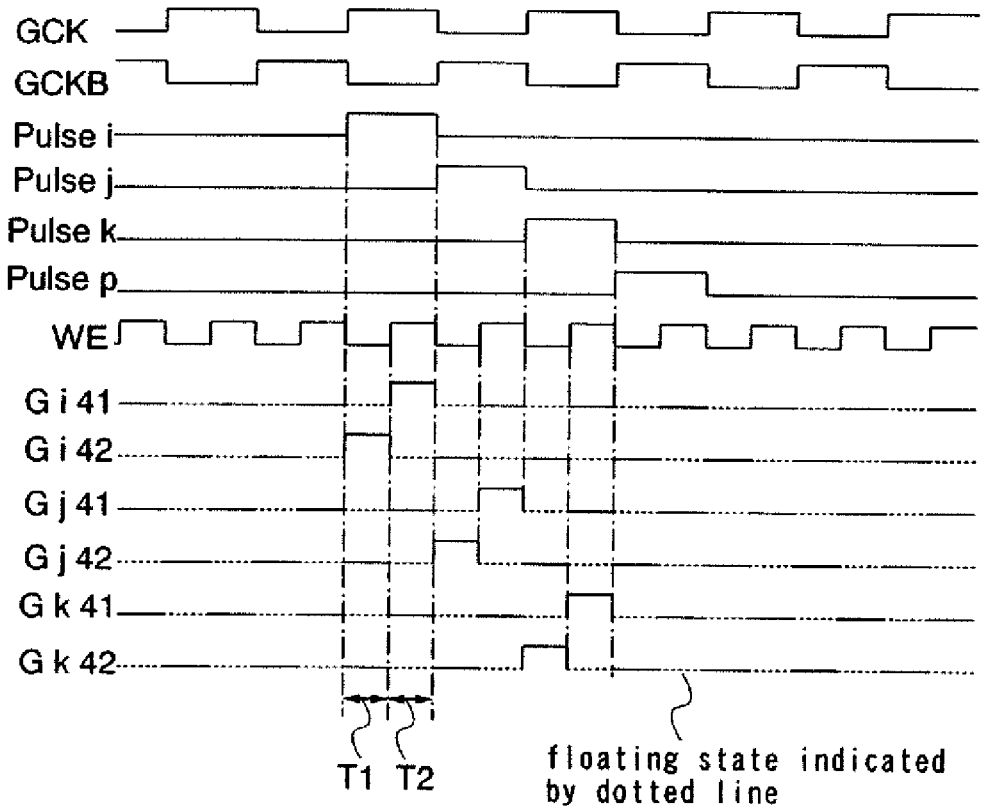

Operation of the first gate driver 41 and the second gate driver 42 is described next. A clock signal (G1CK), a clock inverted signal (G1CKB), and a start pulse (G1SP) are inputted to the pulse output circuit 54, and pulses are sequentially outputted to the selection circuit 55 at the timing of these signals. A clock signal (G2CK), a clock inverted signal (G2CKB), and a start pulse (G2SP) are inputted to the pulse output circuit 56, and pulses are sequentially outputted to the selection circuit 57 at the timing of these signals. FIG. 5B shows the potentials of pulses supplied to the selection circuits 55 and 57 of the i-th, j-th, k-th, and p-th rows (i, j, k, and p are natural numbers, 1=i, j, k, p=n).

When it is assumed that an L level WE signal is transmitted from the selection signal line 52 during a period T1 while an H level WE signal is transmitted during a period T2 similarly to the operation of the source driver 43, the selection circuit 55 in the first gate driver 41 and the selection circuit 57 in the second gate driver 42 operate in each period in the following manner. In the timing chart of FIG. 5B, the potential of the gate line Gy (y is a natural number, 1=y=n) that receives a signal from the first gate driver 41 is denoted by Gy41, while the potential of the gate line that receives a signal from the second gate driver 42 is denoted by Gy42. It is clear that Gy41 and Gy42 denote the same wiring.

In the period T1 (first subgate selection period), an L level WE signal is transmitted from the selection signal line 52. Thus, an L level WE signal is inputted to the selection circuit 55 in the first gate driver 41, thereby the selection circuit 55 is brought into a floating state. On the other hand, an inverted WE signal, namely an H level WE signal is inputted to the selection circuit 57 in the second gate driver 42, thereby the selection circuit 57 is brought into an operating state. That is, the selection circuit 57 transmits an H level signal (row selection signal) to a gate line G1 of the i-th row such that the gate line G1 has the same potential as the H level signal. In other words, the gate line G1 of the i-th row is selected by the second gate driver 42.

As a result, the switching transistor 11 included in the pixel 10 is turned on. Then, the potential of the power supply 53 included in the source driver 43 is transmitted to the gate electrode of the driving transistor 12, thereby the driving transistor 12 is turned off and the two electrodes of the light emitting element 13 have the same potential. That is, the erasing operation where the light emitting element 13 emits no light is performed in this period.

In the period T2 (second subgate selection period), an H level WE signal is transmitted from the selection signal line 52. Thus, an H level WE signal is inputted to the selection circuit 55 in the first gate driver 41, thereby the selection circuit 55 is brought into an operating state. That is, the selection circuit 55 transmits an H level signal to the gate line G1 of the i-th row such that the gate line G1 has the same potential as the H level signal. In other words, the gate line G1 of the i-th row is selected by the first gate driver 41.

As a result, the switching transistor 11 included in the pixel 10 is turned on. Then, the video signal is transmitted from the second latch 48 in the source driver 43 to the gate electrode of the driving transistor 12, thereby the driving transistor 12 is turned on or off and the two electrodes of the light emitting element 13 have different potentials or the same potential. That is, the writing operation where the light emitting element 13 emits light or no light is performed in this period. Meanwhile, an L level signal is inputted to the selection circuit 57 in the second gate driver 42, and the selection circuit 57 is brought into a floating state.

As set forth above, the gate line Gy is selected by the second gate driver 42 during the period T1 (first subgate selection period) while selected by the first gate driver 41 during the period T2 (second subgate selection period). That is, the gate line is controlled by the first gate driver 41 and the second gate driver 42 in a complementary manner. The erasing operation is performed during one of the first and second subgate selection periods, and the writing operation is performed during the other thereof.

During a period when the first gate driver 41 selects the gate line G1 of the i-th row, the second gate driver 42 does not operate (selection circuit 57 is in a floating state), or transmits a row selection signal to the gate lines other than the i-th row. Similarly, during a period when the second gate driver 42 transmits a row selection signal to the gate line G1 of the i-th row, the first gate driver 41 is in a floating state, or transmits a row selection signal to the gate lines other than the i-th row.

According to the invention performing the aforementioned operation, the light emitting element 13 can be turned off forcibly, leading to an increased duty ratio. Further, the light emitting element 13 can be turned off forcibly without providing a TFt for discharging the charges of the capacitor 16, which results in a high aperture ratio. When the high aperture ratio is achieved, the luminance of the light emitting element can be reduced with the increase in light emitting area. That is, the driving voltage can be reduced and thus power consumption can be reduced.

The invention is not limited to the aforementioned embodiment mode where a gate selection period is divided into two periods. The gate selection period may be divided into three or more periods.

Embodiment Mode 3

Figure 6A:
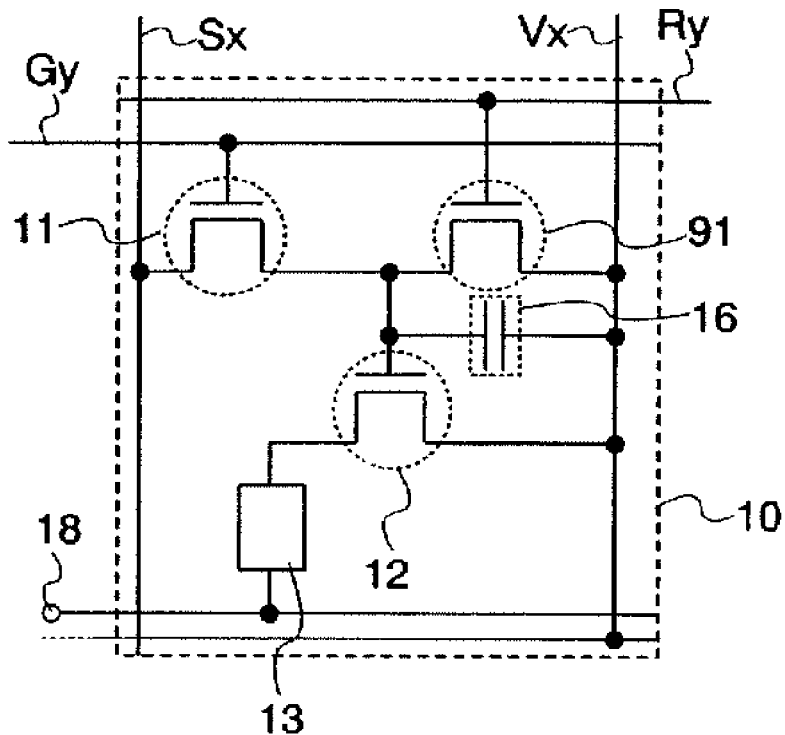
FIGS. 6A and 6B are diagrams each showing a configuration of a display device of the invention.

Description is made on an example of a pixel circuit that can be applied to the display device of the invention. FIG. 6A shows a pixel circuit where an erasing transistor 91 and an erasing gate line Ry are added to the pixel 10 shown in FIG. 2A (one pixel includes three TFTs). The erasing transistor 91 can forcibly stop current flow in the light emitting element 13. Therefore, a lighting period can start with or immediately after the start of a writing period without waiting for signals to be written to all the pixels 10. Accordingly, duty ratio can be increased, and particularly moving images can be displayed with high quality.

Figure 6B:
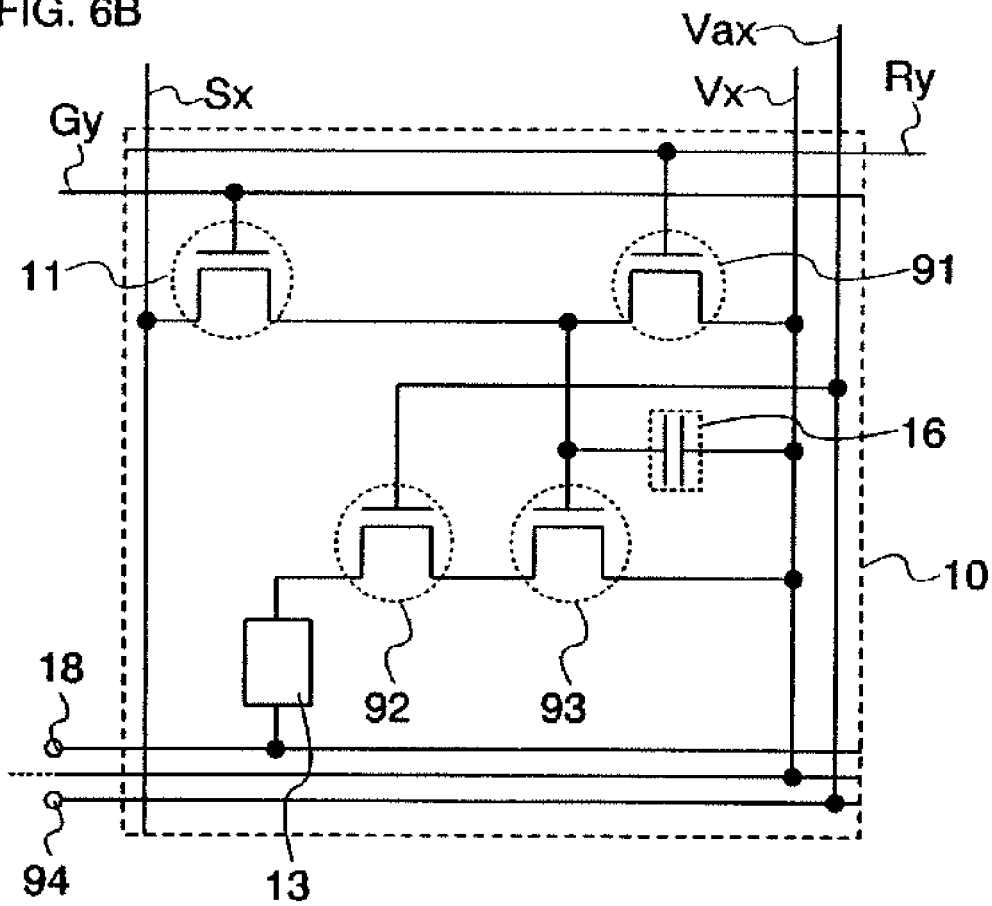

FIG. 6B shows a pixel circuit where the driving transistor 12 in the pixel 10 shown in FIG. 6A is omitted and transistors 92 and 93 and a power supply line Vax (x is a natural number, 1=x=m) are additionally provided (one pixel includes four TFTs). The power supply line Vax is connected to a power supply 94. According to this structure, a gate electrode of the transistor 92 is connected to the power supply line Vax with a constant potential, thereby the potential of the gate electrode of the transistor 92 is fixed and the transistor 92 operates in a saturation region. Meanwhile, the transistor 93 operates in a linear region, and a video signal including data on light emission or non-light emission of the pixel 10 is inputted to a gate electrode of the transistor 93. Since the transistor 93 operating in a linear region has a small source-drain voltage, a slight change in the gate-source voltage of the transistor 93 does not influence a current value flowing through the light emitting element 13. Thus, the current value flowing through the light emitting element 13 is determined by the transistor 92 operating in a saturation region. According to the invention having the aforementioned structure, it is possible to suppress luminance unevenness due to variations in characteristics of the transistor 92 and increase the image quality.

Figure 2A:
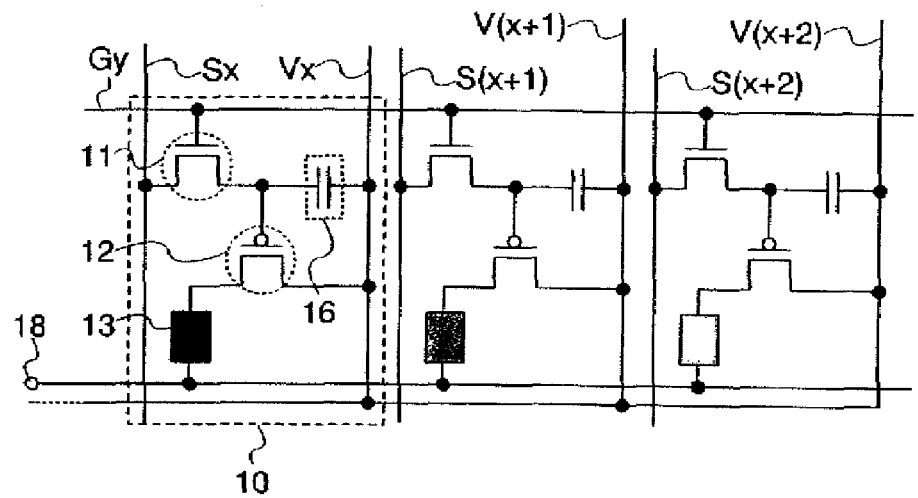
FIGS. 2A and 2B are diagrams each showing a configuration of a display device of the invention.

As another pixel circuit, a pixel circuit where the switching transistor 11 in the pixel 10 shown in FIG. 2A is omitted (one pixel includes one TFT) may be adopted as well. In this case, operation is performed similarly to that of a passive matrix display.

Alternatively, a pixel circuit using a current mirror circuit may also be adopted.

Either an analog video signal or a digital video signal may be used in the display device of the invention. If a digital video signal is used, the video signal may be either a voltage or a current. That is, a video signal inputted to a pixel in light emission of a light emitting element may be either a constant voltage or a constant current. When a video signal is a constant voltage, a constant voltage is applied to a light emitting element or a constant current flows in the light emitting element. When a video signal is a constant current, a constant voltage is applied to a light emitting element or a constant current flows through the light emitting element. When a constant voltage is applied to a light emitting element, a constant voltage drive is performed. Meanwhile, when a constant current flows through a light emitting element, a constant current drive is performed. According to the constant current drive, a constant current flows regardless of changes in resistance of the light emitting element. The display device of the invention may adopt either the constant voltage drive or the constant current drive, though a voltage video signal is preferably used in the display device of the invention.

An electroluminescent layer is made of a material emitting light from a singlet excited state (hereinafter referred to as a singlet excited light emitting material) or a material emitting light from a triplet excited state (hereinafter referred to as a triplet excited light emitting material). For example, among light emitting elements that emit red, green, and blue light, a red light emitting element whose luminance is reduced by half in a relatively short time is made of a triplet excited light emitting material and the rest are made of a singlet excited light emitting material. A triplet excited light emitting material has the advantage that the material has a good luminous efficiency and consumes less power to obtain the same luminance.

Alternatively, a red light emitting element and a green light emitting element may be made of a triplet excited light emitting material and a blue light emitting element may be made of a singlet excited light emitting material. Low power consumption can be further achieved when a green light emitting element having high visibility is made of a triplet excited light emitting material. As an example of a triplet excited light emitting material, there are a metal complex used as a dopant, a metal complex having platinum that is a third transition series element as a central metal, a metal complex having indium as a central metal, and the like. Further, the electroluminescent layer may be formed of any of a low molecular weight material, a medium molecular weight material, and a high molecular weight material.

The light emitting element may adopt a forward stacked structure where an anode, an electroluminescent layer, and a cathode are stacked in this order, or a reverse stacked structure where a cathode, an electroluminescent layer, and an anode are stacked in this order. The anode or the cathode of the light emitting element may be made of indium tin oxide (ITO) that transmits light, ITO added with silicon oxide, indium zinc oxide (IZO), zinc oxide doped with gallium (Ga) (GZO), and the like.

The light emitting element may also adopt a structure where a plurality of electroluminescent layers and charge generation layers are stacked between an anode and a cathode such that an anode, an electroluminescent layer, a charge generation layer, . . . , an electroluminescent layer, a charge generation layer, . . . , an electroluminescent layer, and a cathode are stacked in this order. Such an element is also called a tandem element. The charge generation layer is made of an inorganic semiconductor such as metal or molybdenum oxide, an organic compound doped with lithium, or the like.

When color display is performed using a panel having a light emitting element, electroluminescent layers having different emission wavelength bands may be provided in each pixel. Typically, an electroluminescent layer corresponding to each color of red (R), green (G), and blue (B) is provided. In such a case, the monitoring light emitting element 66 corresponding to each color of red, green, and blue may be provided to correct a power supply potential for each color. At this time, color purity can be increased and a pixel portion can be prevented from having a mirror surface (glare) by providing a filter (colored layer) that transmits light of a specific wavelength band on the light emitting side of a light emitting element. Providing a filter (colored layer) can omit a circular polarizer or the like that is conventionally required and can eliminate the loss of light emitted from the electroluminescent layer. Further, change in hue that occurs when a pixel area is obliquely seen can be reduced.

The electroluminescent layer can have a structure that emits monochrome or white light. If a white light emitting material is used, a filter that transmits light having a specific wavelength is provided on the light emitting side of a light emitting element, thereby color display can be performed.

Embodiment Mode 4

Changes with time of a light emitting element progress rapidly in the initial stages and gradually slow down with time. Accordingly, in a display device using a light emitting element, it is preferable to perform an initial aging process where initial changes with time occur in all the light emitting elements before adjustment of the luminance of the light emitting elements (e.g., before shipment of the display device).

When initial drastic changes with time of a light emitting element occur in advance by such an initial aging process, changes with time do not progress rapidly thereafter, which reduces the phenomenon due to the changes with time such as image burn-in.

The initial aging process is performed by activating a light emitting element only during a certain period, and preferably by applying a voltage higher than usual. According to this, initial changes with time occur in a short time and the initial aging process can be completed immediately.

If the display device of the invention operates using a rechargeable battery, it is preferable to perform, during charging the display device that is not in use, a process of lighting or flashing all the pixels, a process of displaying an image whose contrast is inverted relative to a normal image (e.g., standby display or the like), a process of detecting a pixel that emits light at a low frequency by sampling a video signal and lighting or flashing the pixel, and the like. The aforementioned process is performed in order to reduce image burn-in during a period when the display device is not in use, and called a flashout process. Even when image burn-in occurs after the flashout process, the difference between the brightest point and the darkest point of the burned-in image can be set to five level gray scale or less, and more preferably one level gray scale or less. In order to reduce image burn-in, a fixed image may be reduced as much as possible in addition to the aforementioned process.

Embodiment Mode 5

Description is made on a panel that is one mode of the display device of the invention, which incorporates the pixel area 40, the first gate driver 41, the second gate driver 42, and the source driver 43. The pixel area 40 having a plurality of pixels each including the light emitting element 13, the first gate driver 41, the second gate driver 42, the source driver 43, and a connection film 407 are provided over the substrate 20 (see FIG. 7A). The connection film 407 is connected to an external circuit (IC chip).

Figure 7A:
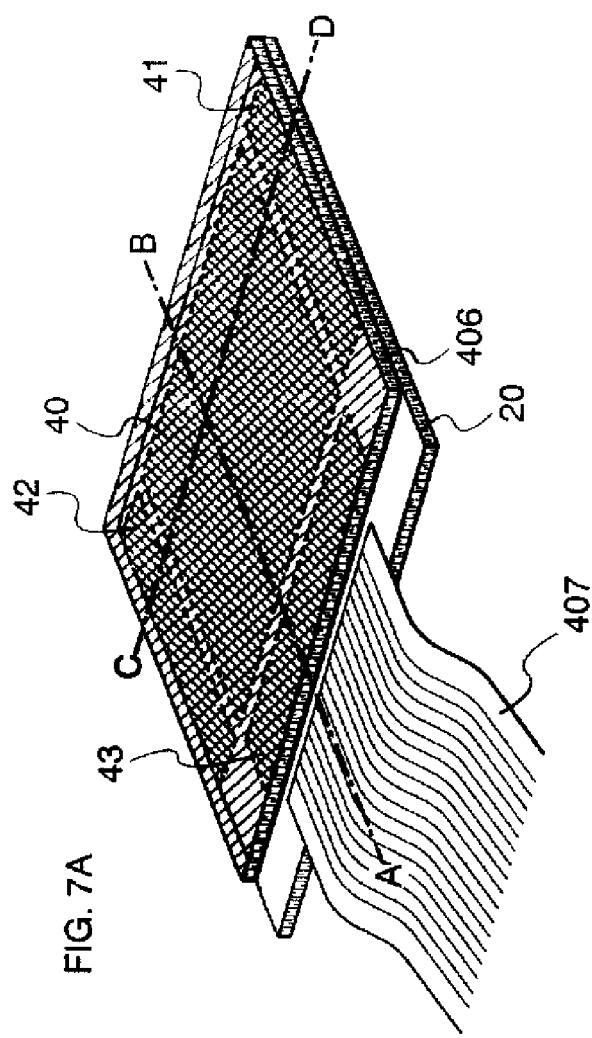
FIGS. 7A and 7B are diagrams each showing a panel that is one mode of the display device of the invention.
Figure 7B:
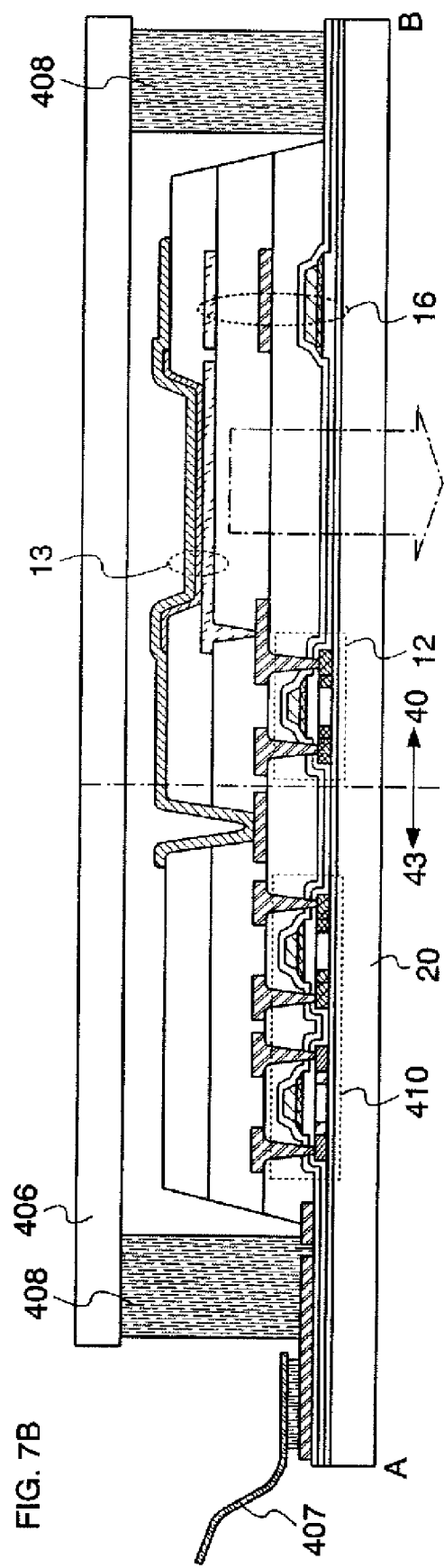

FIG. 7B is a cross sectional view along a line A-B of the panel. FIG. 7B shows the driving transistor 12, the light emitting element 13, and the capacitor 16 that are formed in the pixel area 40, and a CMOS circuit 410 formed in the source driver 43.

A sealing material 408 is provided at the periphery of the pixel area 40, the first gate driver 41, the second gate driver 42, and the source driver 43. The light emitting element 13 is sealed with the sealing material 408 and an opposite substrate 406. This sealing process is performed in order to protect the light emitting element 13 from moisture. In this embodiment mode, a cover material (made of glass, ceramics, plastic, metal or the like) is used for sealing, though a heat curable resin or a UV light curable resin may be used as well as a high barrier thin film such as metal oxide and nitride. The elements over the substrate 20 are preferably formed of a crystalline semiconductor (polycrystalline silicon) having superior characteristics in mobility and the like as compared with an amorphous semiconductor, thereby the elements can be monolithically formed on the same surface. The panel having the aforementioned structure can reduce the number of external ICs to be connected, leading to reduction in size, weight, and thickness.

Figure 18:
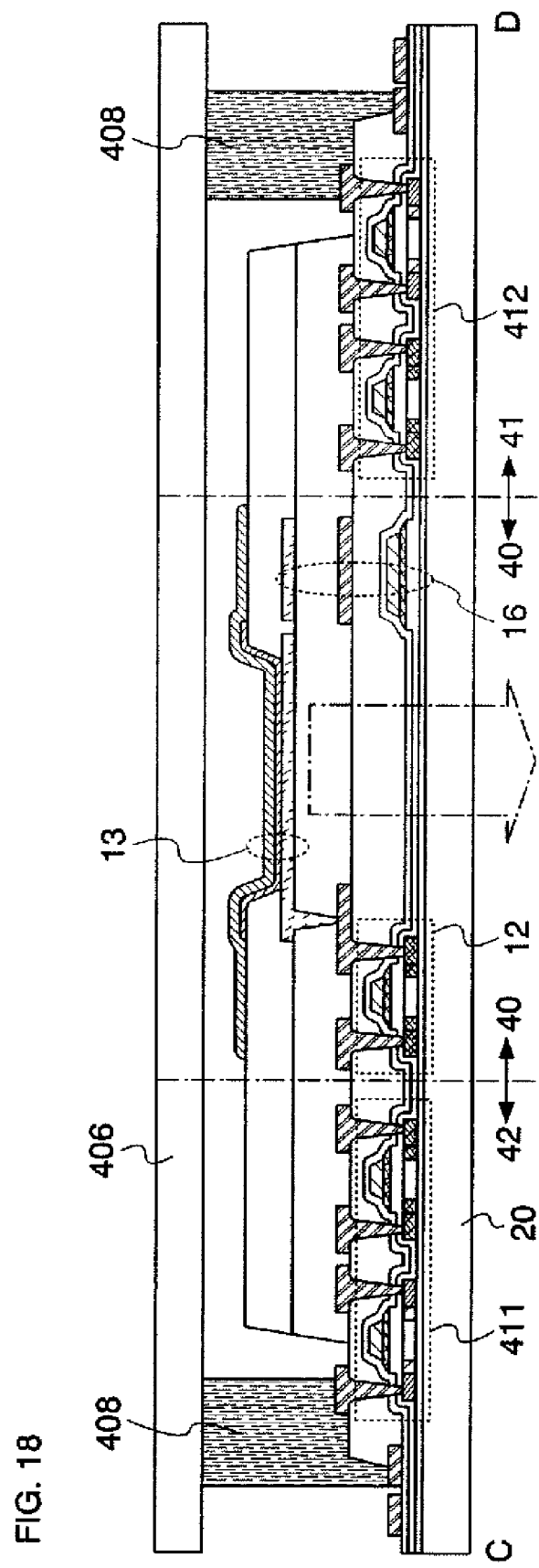
FIG. 18 is a diagram showing a panel that is one mode of the display device of the invention.

FIG. 18 is a cross sectional view along a line C-D of the panel, and shows the driving transistor 12, the light emitting element 13, and the capacitor 16 that are provided in the pixel area 40, a CMOS circuit 412 provided in the first gate driver 41, and a CMOS circuit 411 provided in the second gate driver 42. The panel shown in the drawing is characterized in that the sealing material 408 is provided so as to overlap the first gate driver 41 and the second gate driver 42. This structure achieves a narrower frame.

In the aforementioned structures shown in FIGS. 7A and 7B and FIG. 18, the pixel electrode of the light emitting element 13 transmits light while the opposite electrode of the light emitting element 13 blocks light. Therefore, the light emitting element 13 performs the bottom emission.

As a structure different from the aforementioned, there is a structure where the pixel electrode of the light emitting element 13 blocks light while the opposite electrode of the light emitting element 13 transmits light (see FIG. 8A). In this case, the light emitting element 13 performs the top emission.

As a structure different from the aforementioned, there is a structure where both the pixel electrode and the opposite electrode of the light emitting element 13 transmit light (see FIG. 8B). In this case, the light emitting element 13 performs the dual emission.

In the case of the bottom emission and the dual emission, a conductive layer (source and drain wirings) connected to the impurity region of the driving transistor 12 is preferably formed of aluminum (Al) combined with a low reflective material such as molybdenum (Mo). Specifically, a stacked structure of Mo, Al—Si, and Mo, or a stacked structure of MoN, Al—Si, and MoN, or the like may be adopted. As a result, light emitted from the light emitting element can be prevented from reflecting the source and drain wirings, thereby the light can be extracted outside. The display device of the invention may adopt any of the bottom emission, the top emission, and the dual emission.

The pixel area 40 may be constituted by a TFT that is formed over an insulating surface and has a channel portion formed of an amorphous semiconductor (amorphous silicon), and the first gate driver 41, the second gate driver 42, and the source driver 43 may be constituted by an IC chip. The IC chip may be attached onto the substrate 20 by COG or attached to the connection film 407 connected to the substrate 20. The amorphous semiconductor can be easily formed over a large substrate by CVD and requires no crystallization step, and thus provides an inexpensive panel. Further, when a conductive layer is formed by droplet discharging typified by ink jet method, a more inexpensive panel can be achieved.

Embodiment Mode 6

An electronic device provided with a pixel area including a light emitting element includes a television set (also called a television or a television receiver), a digital camera, a digital video camera, a mobile phone set (also called a mobile phone or a cellular phone), a portable information terminal such as a PDA, a portable game machine, a monitor for a computer, a computer, an audio reproducing device such as an in-car audio system, an image reproducing device provided with a recording medium such as a home game machine, and the like. Specific examples of them are described with reference to FIGS. 9A to 9F.

Figure 9A:
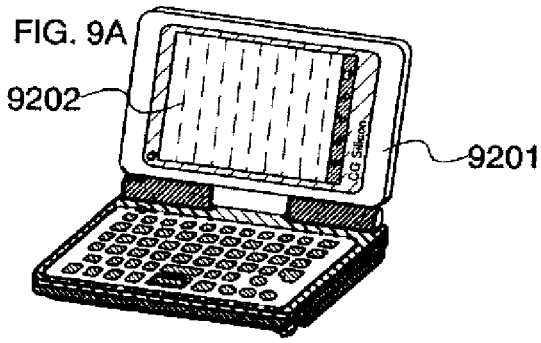
FIGS. 9A to 9F are views each showing an example of an electronic device using a display device of the invention.

A portable information terminal includes a main body 9201, a display portion 9202 and the like (see FIG. 9A). The display devices shown in Embodiment Modes 1 to 5 can be applied to the display portion 9202. According to the invention, a power supply potential supplied to a light emitting element is corrected using a monitoring light emitting element, and it is thus possible to provide a display device where the influence of variations in current of the light emitting element due to changes in ambient temperature and changes with time can be suppressed.

Figure 9B:
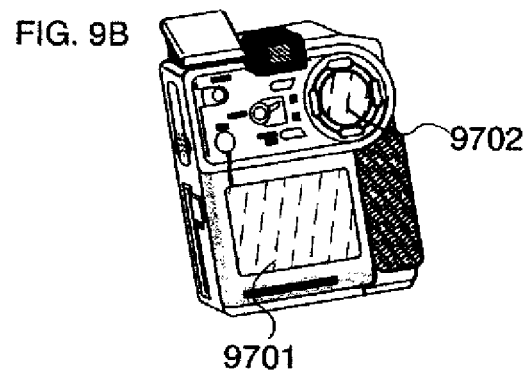

A digital video camera includes a display portion 9701, a display portion 9702 and the like (see FIG. 9B). The display devices shown in Embodiment Modes 1 to 5 can be applied to the display portion 9701. According to the invention, a power supply potential supplied to a light emitting element is corrected using a monitoring light emitting element, and it is thus possible to provide a display device where the influence of variations in current of the light emitting element due to changes in ambient temperature and changes with time can be suppressed.

Figure 9C:
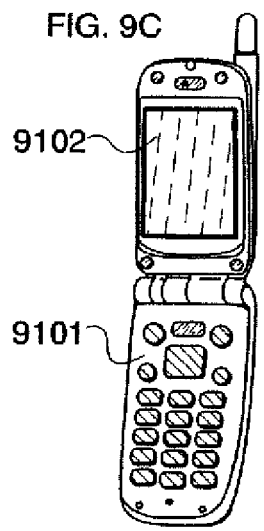

A portable terminal includes a main body 9101, a display portion 9102 and the like (see FIG. 9C). The display devices shown in Embodiment Modes 1 to 5 can be applied to the display portion 9102. According to the invention, a power supply potential supplied to a light emitting element is corrected using a monitoring light emitting element, and it is thus possible to provide a display device where the influence of variations in current of the light emitting element due to changes in ambient temperature and changes with time can be suppressed.

Figure 9D:
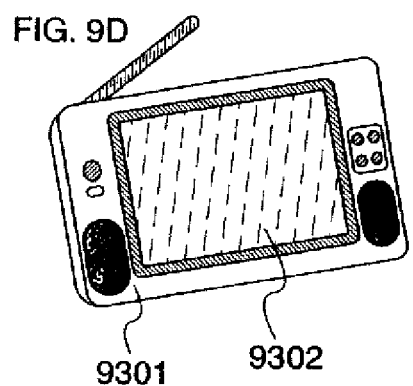

A portable television set includes a main body 9301, a display portion 9302 and the like (see FIG. 9D). The display devices shown in Embodiment Modes 1 to 5 can be applied to the display portion 9302. According to the invention, a power supply potential supplied to a light emitting element is corrected using a monitoring light emitting element, and it is thus possible to provide a display device where the influence of variations in current of the light emitting element due to changes in ambient temperature and changes with time can be suppressed. Such a television set can be widely applied to a small size one incorporated in a portable terminal such as a mobile phone, a medium size one that is portable, and a large size one (e.g., 40 inches in size or more).

Figure 9E:
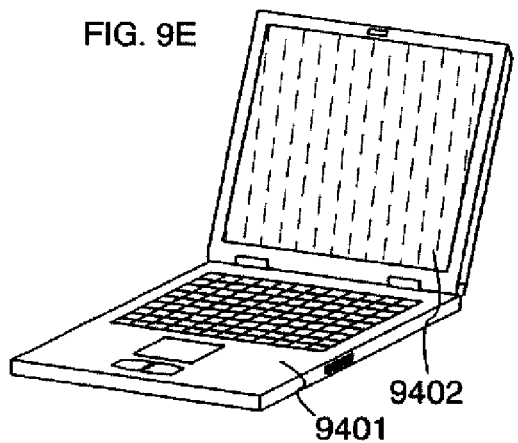

A portable computer includes a main body 9401, a display portion 9402 and the like (see FIG. 9E). The display devices shown in Embodiment Modes 1 to 5 can be applied to the display portion 9402. According to the invention, a power supply potential supplied to a light emitting element is corrected using a monitoring light emitting element, and it is thus possible to provide a display device where the influence of variations in current of the light emitting element due to changes in ambient temperature and changes with time can be suppressed.

Figure 9F:
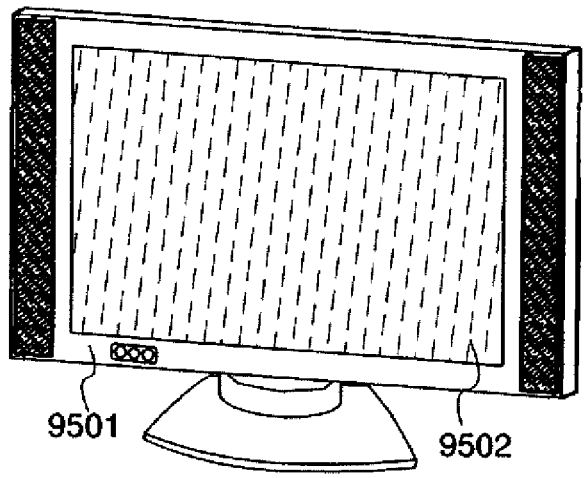
Figure 10A:
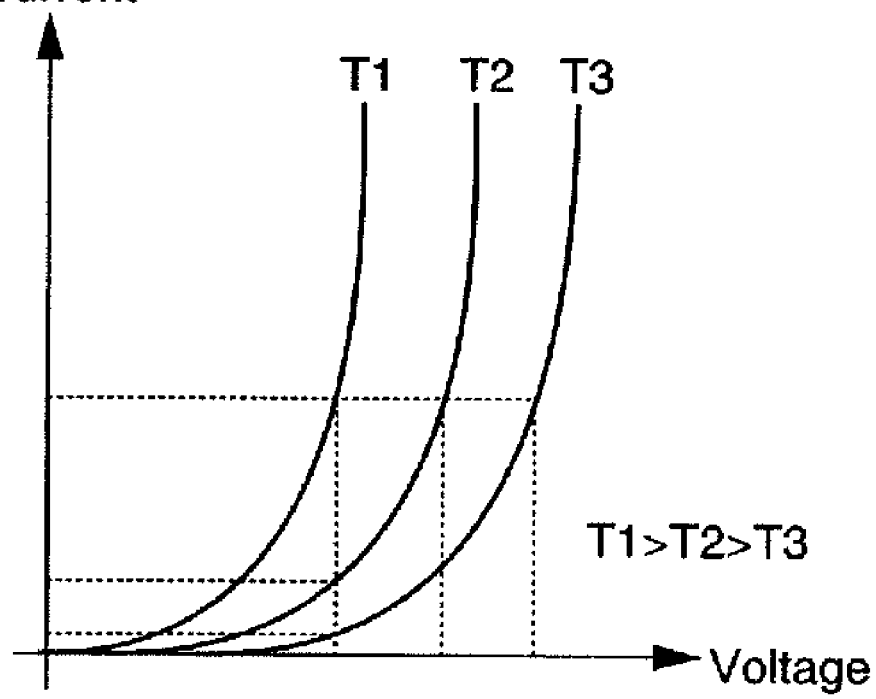
FIGS. 10A and 10B are graphs each showing temperature characteristics and characteristics with time of a light emitting element.
Figure 10B:
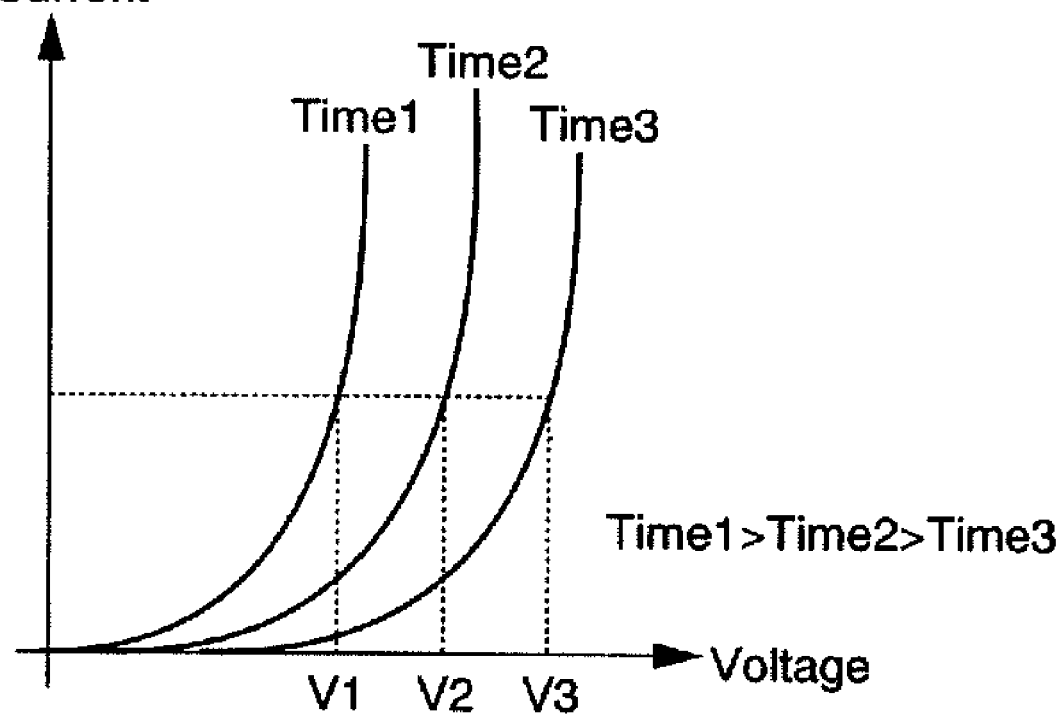

A television set includes a main body 9501, a display portion 9502 and the like (see FIG. 9F). The display devices shown in Embodiment Modes 1 to 5 can be applied to the display portion 9502. According to the invention, a power supply potential supplied to a light emitting element is corrected using a monitoring light emitting element, and it is thus possible to provide a display device where the influence of variations in current of the light emitting element due to changes in ambient temperature and changes with time can be suppressed.

If the aforementioned electronic devices use a rechargeable battery, the life of them increases with reduction in power consumption, thereby the charge of the rechargeable battery can be saved.

Embodiment Mode 7

A cross sectional structure of a display device performing color display is described with reference to drawings. More specifically, a cross sectional structure of a display device using a white light emitting element that emits white light and a colored layer is described. Shown below is a cross sectional structure of three pixels adjacent to each other.

Figure 22:
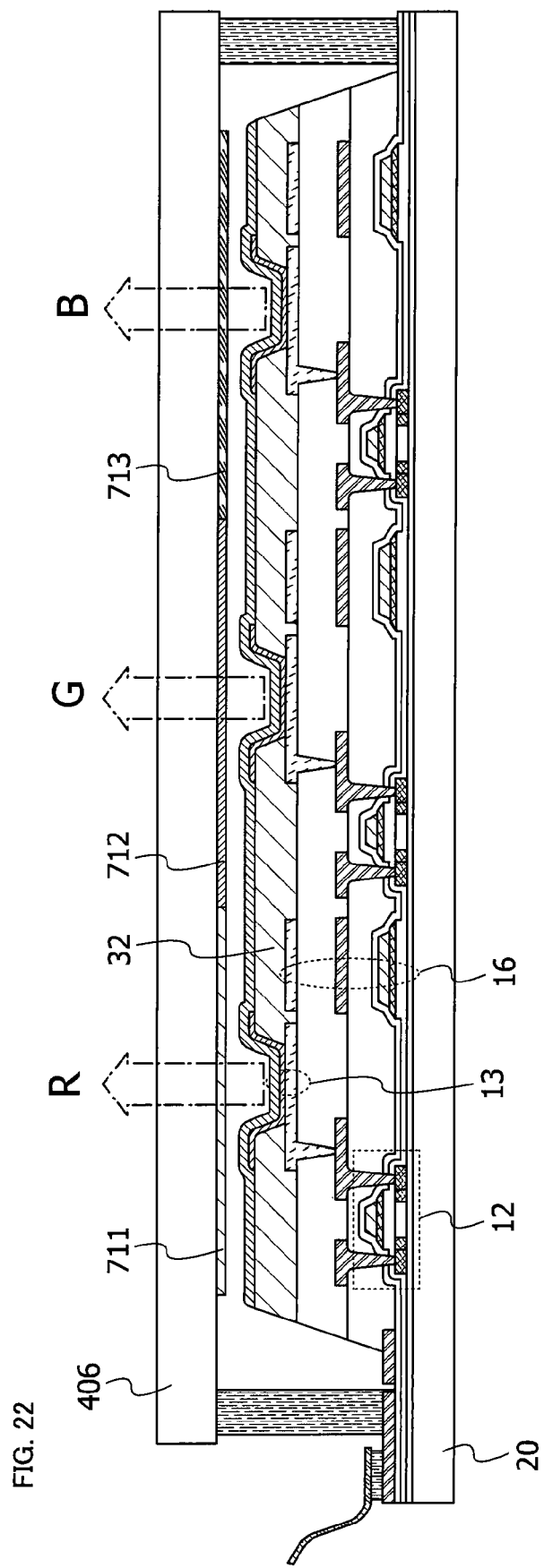
FIG. 22 is a diagram showing a configuration of a display device of the invention.

The driving transistor 12, the light emitting element 13 that emits white light (hereinafter referred to as the white light emitting element 13), and the capacitor 16 are provided over the substrate 20 (see FIG. 22). The white light emitting element 13 performs the top emission. The bank layer 32 that blocks light is also provided. The bank layer 32 that blocks light is formed by agitating carbon particles, metal particles, a pigment, a colorant and the like, filtering them if necessary, and then spin coating. Note that if carbon particles or metal particles are added to an organic material, a surface active agent or a dispersing agent may be added so that they are mixed evenly.

Colored layers 711 to 713 are provided over the opposite substrate 406, and typically correspond to red, green, or blue.

The white light emitting element 13 is provided so as to overlap the colored layers 711 to 713 when the substrate 20 is attached to the opposite substrate 406. More specifically, the white light emitting element 13 is provided such that the light emitting side thereof faces the colored layers 711 to 713. According to the aforementioned structure, white light emitted from the white light emitting element 13 changes into red, green, or blue, thereby a color display device can be obtained.

Figure 23:
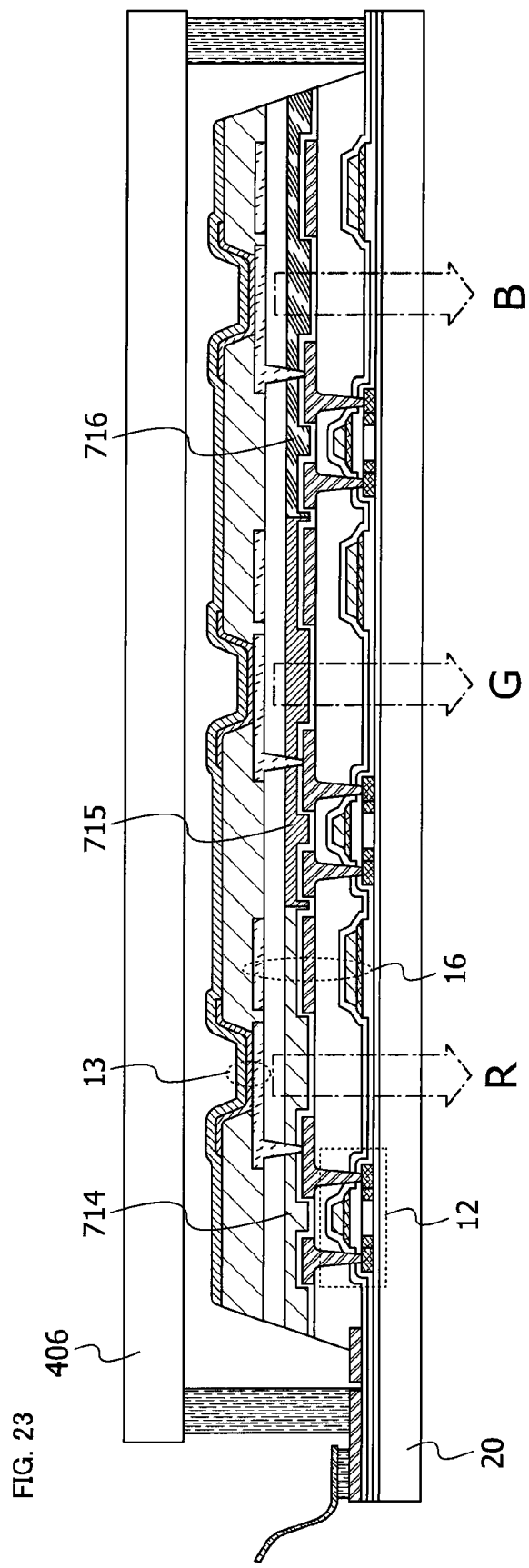
FIG. 23 is a diagram showing a configuration of a display device of the invention.

A structure of the display device where the white light emitting element 13 performs the bottom emission is described with reference to FIG. 23. In this case, as shown in the drawing, colored layers 714 to 716 are provided as interlayer insulating layers. Alternatively, the colored layers 714 to 716 may be provided between the substrate 20 and the driving transistor 12 or the capacitor 16. In such a case, an active layer of the driving transistor 12 is preferably formed of an amorphous semiconductor instead of a polycrystalline semiconductor in view of poor heat resistance of the colored layers. As a result, the colored layers 714 to 716 can be prevented from being damaged due to heat treatment during manufacturing steps of a polycrystalline semiconductor.

Figure 24:
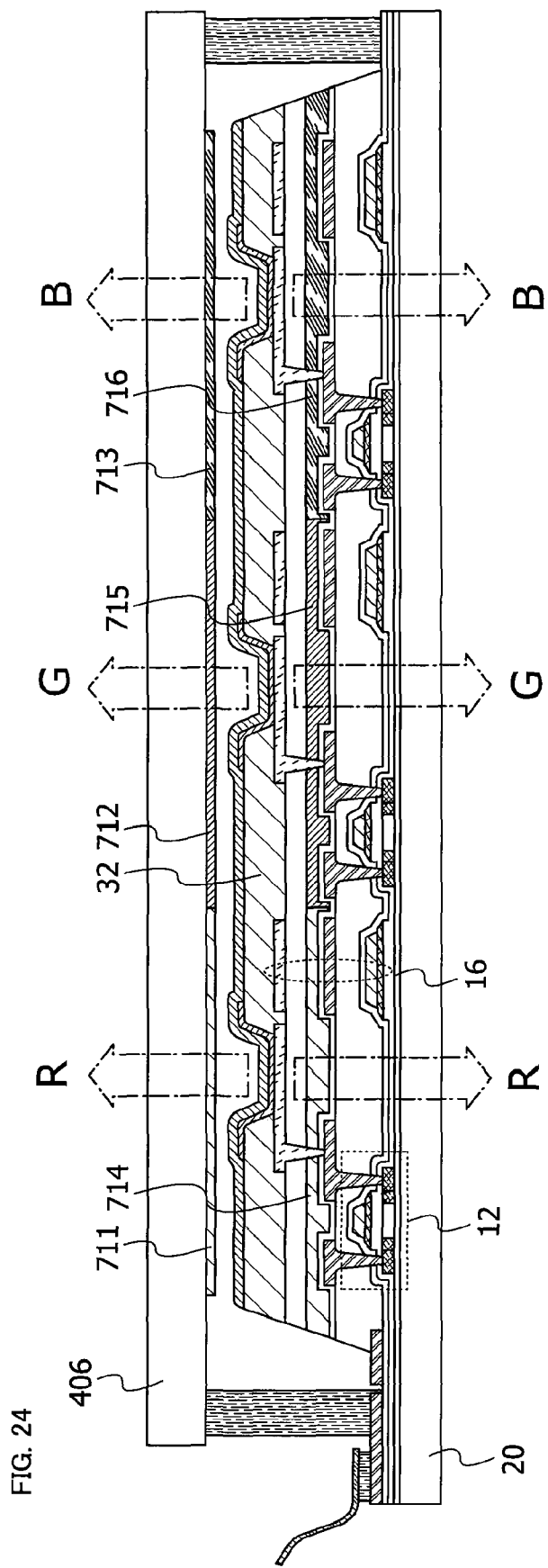
FIG. 24 is a diagram showing a configuration of a display device of the invention.

A structure of the display device where the white light emitting element 13 performs the dual emission is described with reference to FIG. 24. The structure shown in FIG. 24 is a combination of the structures shown in FIGS. 22 and 23. The colored layers 711 to 716 are provided so as to sandwich the white light emitting element 13, such that the white light emitting element 13 emits light in the opposite directions.

An electroluminescent layer of a light emitting element is formed by vapor deposition, spin coating, ink jet method and the like. However, electroluminescent layers with different wavelength bands cannot be formed with accuracy by the aforementioned methods. Thus, in such a case, it is necessary to increase the distance between different pixels and the distance between banks. Meanwhile, if a white light emitting element is used as shown in the aforementioned structure, different electroluminescent layers are not to be formed, which is advantageous in that the distance between pixels and the distance between banks are not required to increase and high definition can be achieved. In addition, since a color filter is used in a liquid crystal display device, the technology of the liquid crystal display device can be utilized without developing new technology.

Figure 25:
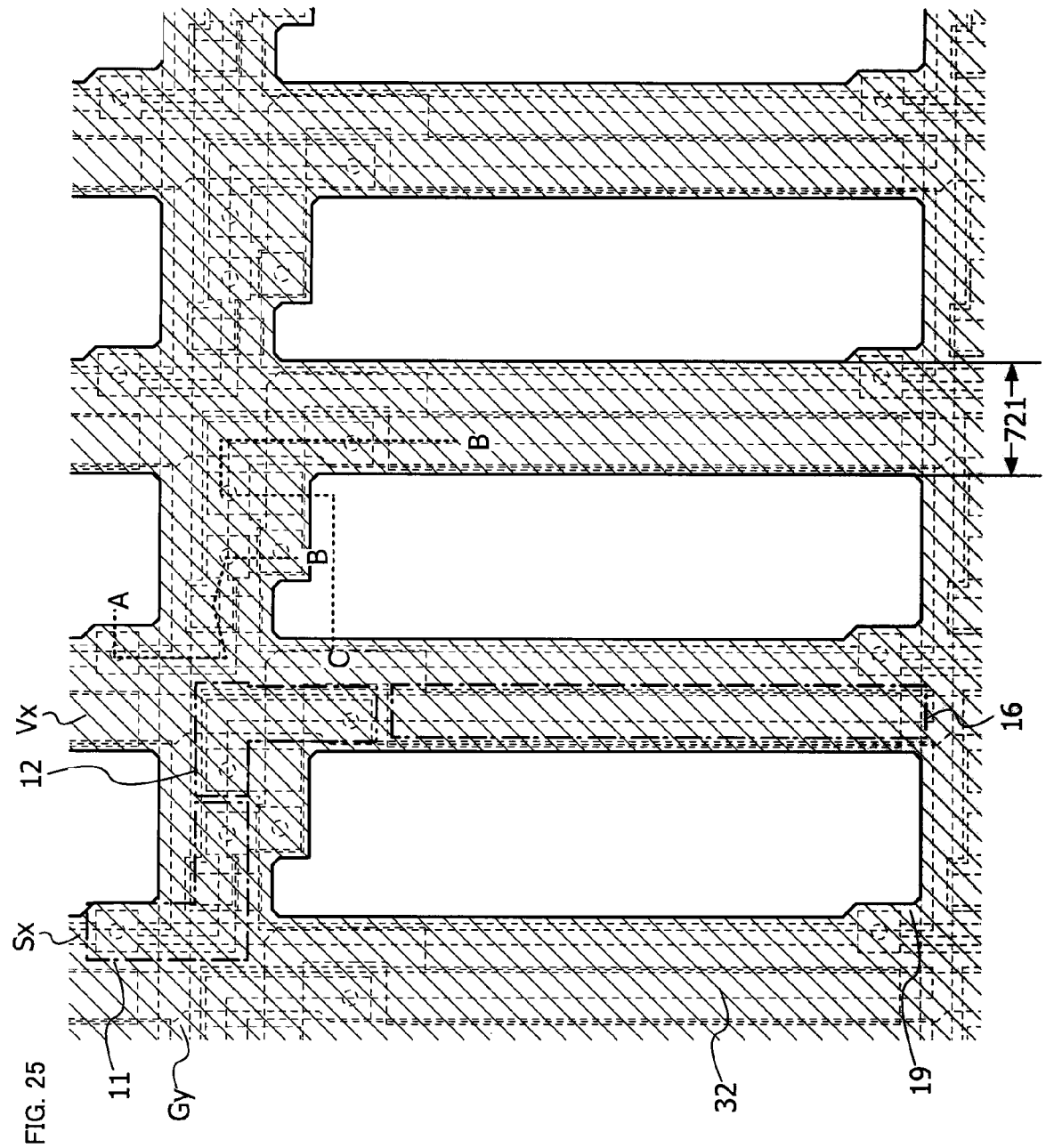
FIG. 25 is a diagram showing a configuration of a display device of the invention.

The width of the bank layer 32 between pixels in the lateral direction is only required to be wide enough to cover a wiring formed thereunder, specifically 7.5 to 27.5 μm, and more preferably 10 to 25 μm (see FIG. 25). The narrower width of the bank layer 32 allows a higher aperture ratio. The high aperture ratio increases a light emitting area, which results in lower driving voltage and power consumption.

Light emitted from the white light emitting element may be reflected repeatedly in the pixel electrode and the opposite electrode and escape to the adjacent pixels depending on the light exit angle. Further, in a display area including a plurality of pixels arranged in matrix, glare due to the pixel electrode and the opposite electrode may occur in a pixel displaying black. In order to prevent such glare, an optical film is attached in some cases, though it costs a lot.

However, according to the aforementioned structure, the bank layer 32 is made of a material that blocks light. If the bank layer 32 blocks light, it absorbs unnecessary light to clearly define boundaries between pixels, and thus high definition images can be displayed. In addition, an insulating film that blocks light reduces the reflection of incident light, and glare can be prevented. Therefore, an optical film such as a polarizer is not necessary any more, leading to reduction in size, thickness, and weight.

A triplet excited light emitting material including a metal complex or the like as well as a singlet excited light emitting material may be used for the electroluminescent layer of the white light emitting element 13. As an example of a triplet excited light emitting material, there are known a metal complex used as a dopant, a metal complex having platinum that is a third transition series element as a central metal, a metal complex having iridium as a central metal, and the like. The triplet excited light emitting material is not limited to these compounds and it is also possible to use a compound having the aforementioned structure and having an element belonging to Groups 8 to 10 of the periodic table as a central metal.

A light emitting element that emits white light may be constituted by two or three light emitting layers including a blue electroluminescent layer. Alternatively, a white light emitting element may be formed by arbitrarily stacking a functional layer such as a hole injecting/transporting layer, a hole transporting layer, an electron injecting/transporting layer, an electron transporting layer, a light emitting layer, an electron blocking layer, and a hole blocking layer. Further, a mixed layer or a mixed connection of these layers may also be formed. This embodiment mode can be freely combined with the aforementioned embodiment modes.

Embodiment Mode 8

The invention provides a display device having a white light emitting element and a monitoring white light emitting element, where the duty ratio of the white light emitting element is 45 to 80% while the duty ratio of the monitoring white light emitting element is 45 to 100%.

The duty ratio of the white light emitting element is the average duty ratio of all the white light emitting elements provided in a pixel area. The duty ratio is the ratio of a lighting period to a lighting period and a non-light emitting period such as a writing period when all the inputted video signals display white.

The invention provides a display device where the total amount of current in a white light emitting element during a certain period is less than the total amount of current in a monitoring white light emitting element.

In this manner, the load on the white light emitting element is made different from the load on the monitoring white light emitting element, and luminance decay is taken into consideration based on the amount of charge flowing through the white light emitting element. Accordingly, constant luminance drive can be performed where the amount of charge in the white light emitting element is compared with the amount of charge in the monitoring white light emitting element, and the luminance of the white light emitting element is corrected so as to be constant.

The principle of constant luminance drive (hereinafter referred to as CL drive) according to the invention is described below. A light emitting element used for the description has a structure where a thin film containing an organic material generating EL is sandwiched between a pair of electrodes.

A current flowing through a thin film containing an organic material generating EL (hereinafter also referred to as an organic thin film) is called a trap charge limited current (TCLC) and represented by the following formula where J is a current density, V is a voltage, S is a value determined by the material and structure of the light emitting element, and n is a value of 2 or more.

$$J = S \cdot V^n \quad (1)$$

The following formula can be obtained by modifying the formula (1).

$$\log J = n \cdot \log V + \log S \quad (2)$$

The formula (2) represents current-voltage characteristics indicated on a logarithmic scale, which is represented by a straight line with a slop of n. The smaller the value of log S becomes, the higher voltage side the straight line is shifted to.

Figure 26:
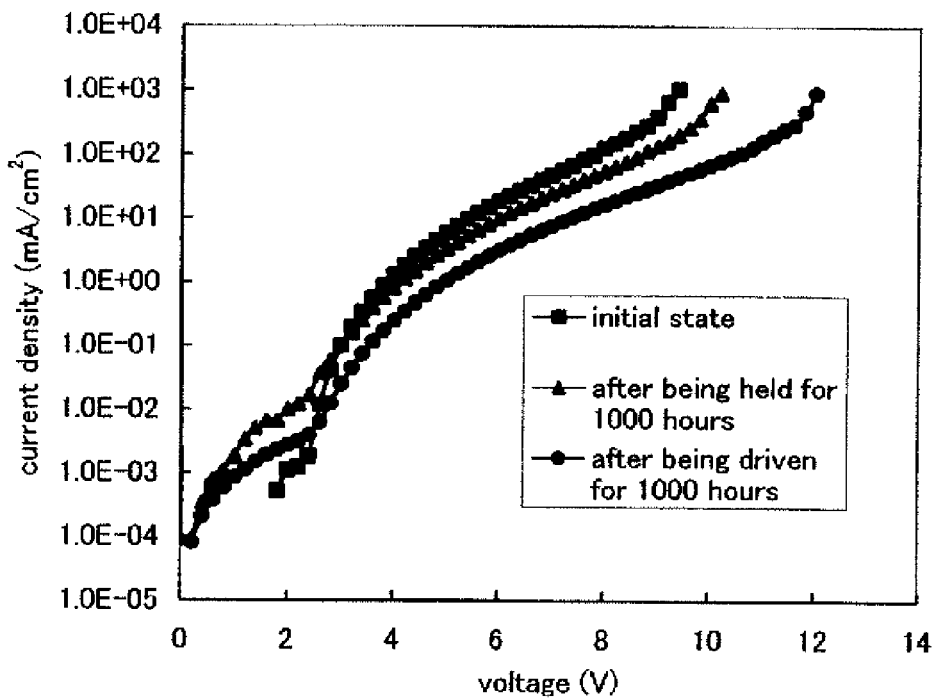
FIG. 26 is a graph showing current density-voltage characteristics of a light emitting element.

FIG. 26 is a graph showing typical current density-voltage characteristics of a light emitting element. The element has a stacked structure of an anode, DNTPD, NPB, Alq: C6, Alq, $CaF_2$, and Al. The graph shows characteristics in the initial state, characteristics after being held for 1000 hours at room temperature, and characteristics after being driven with constant current for 1000 hours at room temperature.

As shown in FIG. 26, the current density-voltage characteristics of the light emitting element that has been driven with constant current for 1000 hours at room temperature are shifted to a higher voltage side than the initial characteristics. Similarly, the current density-voltage characteristics of the light emitting element that has been held for 1000 hours at room temperature without flowing current are shifted to a higher voltage side.

Figure 27:
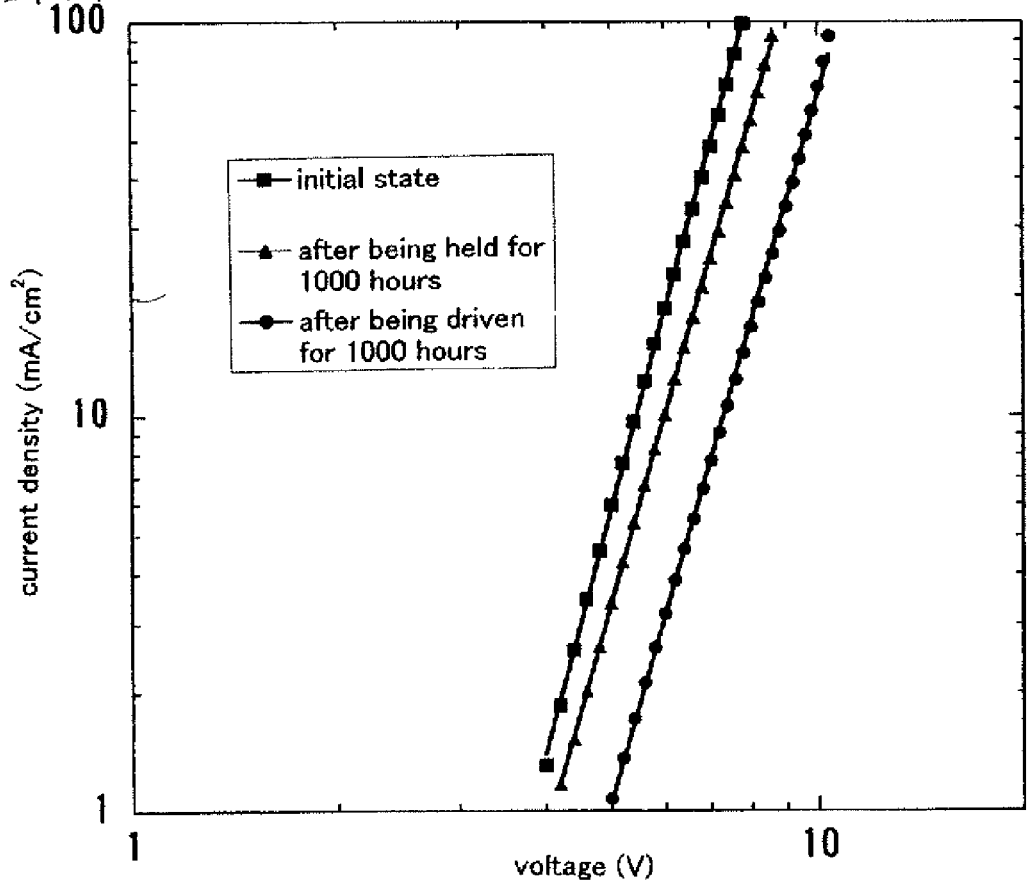
FIG. 27 is a graph showing current density-voltage characteristics of a light emitting element.

FIG. 27 is a double logarithmic graph obtained by plotting the aforementioned three types of current density-voltage characteristics based on the formula (2) in a current density region where practical luminance can be obtained. In the graph of FIG. 27, the current density-voltage characteristics are plotted against a current density of 1 to 100 mA/cm$^2$ where a luminance of 100 to 10000 cd/m$^2$ can be obtained. In the graph of FIG. 27, the current density-voltage characteristics are represented by straight lines with a slop of n.

Figure 28:
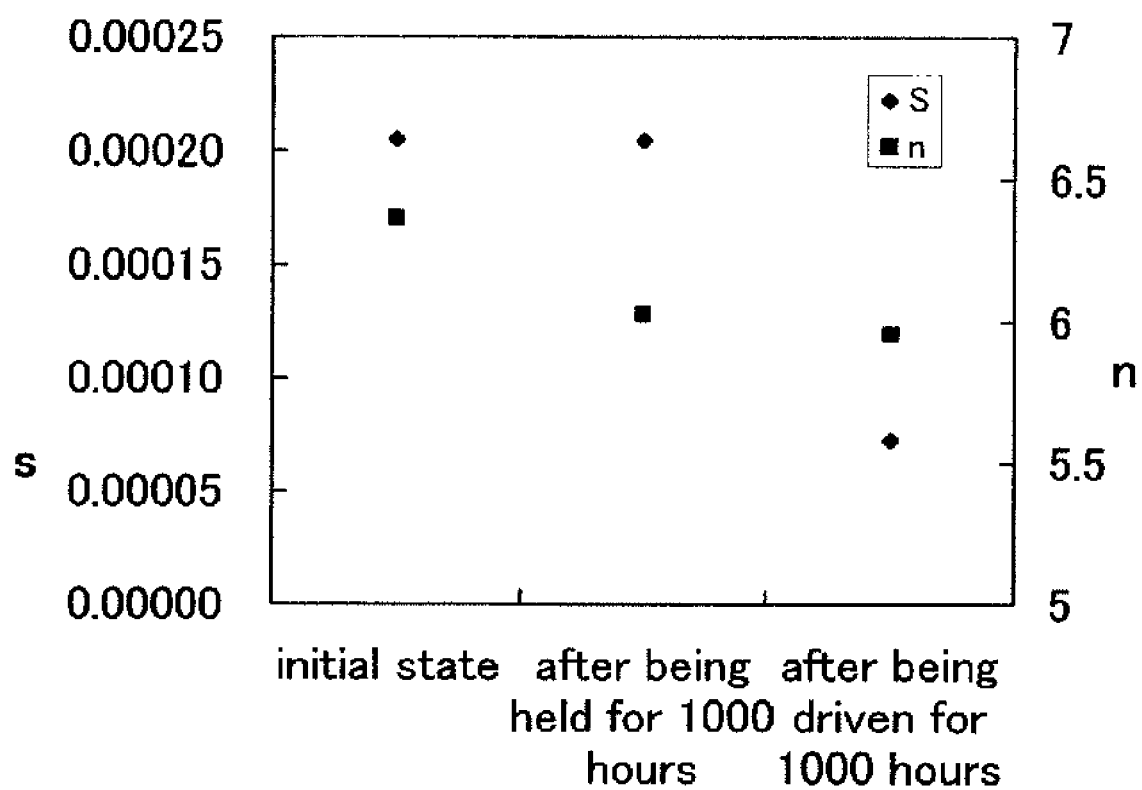
FIG. 28 is a graph showing changes of n and s.

FIG. 28 shows changes in n and S obtained by the graph of FIG. 27. The graph of FIG. 28 indicates characteristic changes in parameters of n and S based on the formula (2). The value of S does not vary when the light emitting element is held at room temperature, and decreases drastically when a current is supplied to the light emitting element. On the other hand, the value of n decreases not only when a current is supplied to the light emitting element but also when the light emitting element is held for the same hours at room temperature. The rate of the decrease when a current is supplied to the light emitting element is substantially the same as that when no current is supplied thereto. That is, n is a parameter that decreases almost exclusively with time regardless of whether a current is supplied or not.

The result shows that n can be represented by the following formula (3) as a function of time.

$$n = f(t) \quad (3)$$

The value of n indicating a precipitous change in diode characteristics shows that diode characteristics of the light emitting element change (the value of n decreases and the slope descends) with time regardless of whether a current is supplied or not.

On the other hand, S is a parameter that hardly changes when the light emitting element is held at room temperature and changes when a current is supplied thereto. The value of S that is independent of time and varies with current can be represented as a function of the total amount of charge Q (current×time), and the following formula can be obtained.

$$S = g(Q) \quad (4)$$

Since the value of S decreases when a current is supplied to the light emitting element, g(Q) is considered to be a monotonically decreasing function. The value of S can be considered to be the threshold of diode characteristics. Therefore, it can be explained that the threshold of diode characteristics of the light emitting element is shifted to a higher voltage side when a current is supplied thereto.

From the formulas (1), (3), and (4), current density-voltage characteristics of the monitoring light emitting element and current density-voltage characteristics of the displaying light emitting element can be represented by the following formulas, where Jo is a current density (constant) of the monitoring light emitting element, Jp is a current density of a pixel, Qm is a total amount of charge in the monitoring light emitting element, Qp is a total amount of charge in the pixel, V is a voltage, and t is time.

$$Jo = g(Qm) \cdot V^{f(t)} \quad (5)$$

$$Jp = g(Qp) \cdot V^{f(t)} \quad (6)$$

From the formulas (5) and (6), the current density Jp in the pixel can be represented by the following formula.

$$Jp = Jo \cdot g(Qp)/g(Qm) \quad (7)$$

Since g(Q) is a monotonically decreasing function, the values of Jo and Jp differ from each other when the monitoring light emitting element and the displaying light emitting element have different currents. For example, more current flows through the monitoring light emitting element than through the displaying light emitting element (i.e., Qm>Qp), Jp is always larger than Jo.

The following consideration should be taken in order to ideally perform the CL drive for keeping the luminance of the displaying light emitting element constant. First, the following formula can be obtained when the luminance of a pixel is L and current efficiency is η.

$$L = \eta \cdot Jp \quad (8)$$

When the initial luminance is Lo and the initial current density is Jo, the current efficiency η is represented by the following degradation curve where k is a rate constant and β is a parameter indicating the initial degradation.

$$\eta = (Lo/Jo) \cdot \exp\{-(k \cdot t)\beta\} \quad (9)$$

As a result, the following formula (10) can be obtained from the formulas (8) and (9).

$$L = Jp \cdot (Lo/Jo) \cdot \exp\{-(k \cdot t)\beta\} \quad (10)$$

In order to maintain the luminance constant, L=Lo (constant) should be satisfied. Thus, when L=Lo is substituted in the formula (10), the following formula (11) can be obtained.

$$Jp = Jo \cdot \exp\{(k \cdot t)\beta\} \quad (11)$$

That is, the CL drive can be achieved by increasing the value of Jp in accordance with the formula (11). Finally, the following formula (12) can be obtained from the formulas (7) and (11).

$$g(Qp)/g(Qm) = \exp\{(k \cdot t)\beta\} \quad (12)$$

Thus, the CL drive can be achieved by controlling the values of Qp and Qm so that g(Qp)/g(Qm) is close to exp{(k·t)β}.

When luminance decay is thus considered based on the amount of charge in the light emitting element, the CL drive can be performed where the amount of charge in the displaying light emitting element is compared with the amount of charge in the monitoring light emitting element, and the luminance of the displaying light emitting element is corrected so as to be constant.

Embodiment 1

Figure 11A:
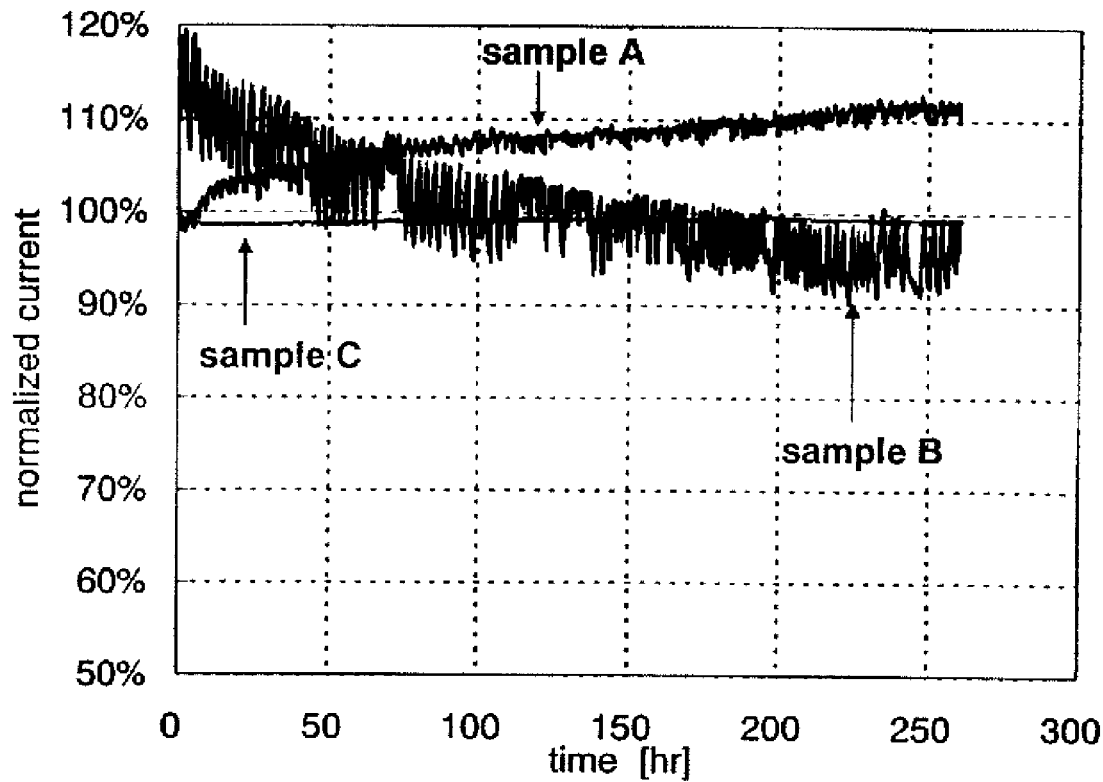
FIGS. 11A and 11B are graphs showing a time-varying current of a light emitting element and a time-varying luminance of a light emitting element respectively.
Figure 11B:
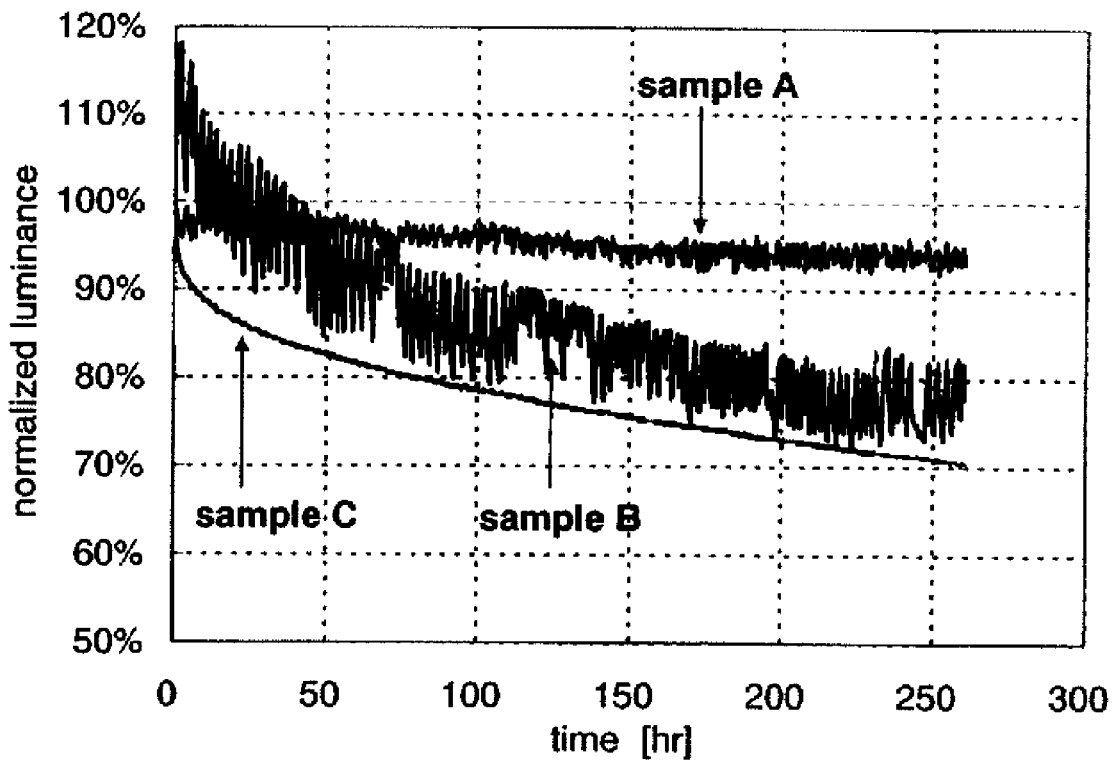

In this embodiment, the test result of a display device of the invention operating at room temperature is described with reference to FIGS. 11A and 11B. FIG. 11A shows the time-varying characteristics of current of a light emitting element (260 hours) while FIG. 11B shows the time-varying characteristics of luminance of a light emitting element (260 hours). In the graphs of FIGS. 11A and 11B, a sample A is a panel having the correction function of the invention whereas a sample B and a sample C are panels having no correction function. The samples A and B are driven with constant voltage and the sample C is driven with constant current.

In the graphs of FIGS. 11A and 11B, the abscissa represents time (hour). The ordinate in FIG. 11A represents a normalized value of the actual current (%) while the ordinate in FIG. 11B represents a normalized value of the actual luminance (%).

In all the samples, the duty ratio of a monitoring light emitting element is 100% whereas the duty ratio of a light emitting element is about 64%. The monitoring light emitting element and the light emitting element have the same total amount of current but different instantaneous currents.

FIG. 11A shows that the current of the sample A tends to increase with time, the current of the sample B fluctuates considerably and tends to decrease with time, and the current of the sample C hardly fluctuates and is kept substantially constant after the elapse of time.

The reason why the current of the sample A tends to increase with time is because the monitoring light emitting element has a duty ratio of 100% while the light emitting element has a duty ratio of 64% and thus changes with time of the monitoring light emitting element progress more rapidly than change with time of the light emitting element.

FIG. 11B shows that the luminance of the sample A hardly fluctuates and is kept substantially constant after the elapse of time, the luminance of the sample B fluctuates considerably and tends to decrease with time, and the luminance of the sample C hardly fluctuates though tends to decrease with time similarly to the sample B.

From the results shown in FIGS. 11A and 11B, it can be found that that the sample A using the invention has a constant luminance though increasing current. This is because changes with time progress more rapidly by an increase $+\Delta$ in current. That is, the increase $+\Delta$ in current due to a correction function is almost equal to the decrease in current due to changes with time. Accordingly, the luminance of the sample A using the invention can be maintained substantially constant.

In view of the aforementioned operation, the display device of the invention having a correction function, which has a constant luminance, can be called a constant luminance display device.

A driving method of the display device of the invention having a correction function can be called a constant luminance drive method (constant brightness method, constant luminescence method, brightness control method, control brightness method, or bright control method). According to this driving method, as set forth above, an increase in current due to a correction function and a decrease in current due to changes with time are obtained in advance, and a light emitting element is driven at a voltage where the increase is equal to the decrease.

A rate of voltage rise for performing the constant luminance drive method is described below.

When the constant current drive is performed at an initial luminance $L_0$ and a current density of $J_0$, a current efficiency $\eta(t)$ that decreases with time is represented by the following formula as a function of time t.

$$\eta(t)=L_0/J_0 \times f(t) \tag{1}$$

It is known that f (t) can be represented by the following exponential function.

$$f(t)=\exp\{-(t/\alpha)\beta\} \tag{2}$$

Note that $\alpha$ is a parameter indicating medium and long-term degradation and $\beta$ is a parameter indicating initial degradation, which can be obtained experimentally.

Meanwhile, if the current density J changes with time t (i.e., J=J(t)), the luminance L can be represented by the following formula.

$$L=\eta(t)\times J(t) \tag{3}$$

Accordingly, in the case of performing the constant luminance drive, the following formula (4) should be satisfied when $L=L_0$ (constant) is satisfied in the formula (3).

$$L_0=\eta(t)\times J(t) \tag{4}$$

By substituting the formula (4) in the formula (1), the following formula can be obtained.

$$J(t)=J_0/f(t) \tag{5}$$

The formula (5) shows the phenomenon that in order to maintain the luminance constant, the current density should gradually increase from $J_0$ taking decrease in current efficiency into consideration. This is because the formula (2) shows that f (t) is a monotonically decreasing function.

In general, current density is proportional to power of voltage (x-th power), and the following formula is thus obtained, where x is a power determined by an element and C is a constant.

$$J(t)=C\times V^x(t) \tag{6}$$

Accordingly, the following formula is obtained by substituting the formula (6) in the formula (5) and taking the formula (2) into consideration.

$$V(t)=\text{Const.}\times[\exp(t/\alpha)\beta]^{1/x} \tag{7}$$

The formula (7) shows how voltage should change to perform the constant luminance drive. Const. is a constant determined by an initial current density $J_0$ and x $(\text{Const.}=(J_0/C)^{1/x})$. The constant luminance drive can be achieved by taking this voltage rise into consideration.

Embodiment 2

The invention can be applied to a display device performing the constant current drive as well.

Figure 19:
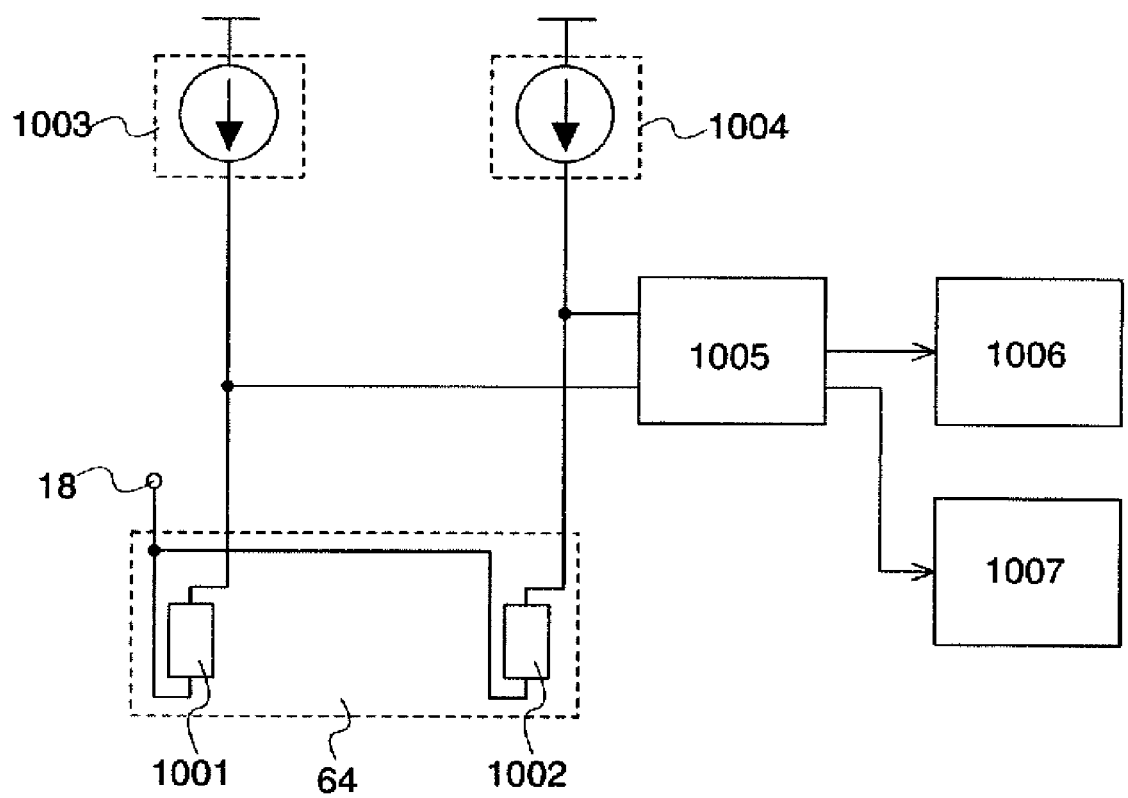
FIG. 19 is a diagram showing a configuration of a display device of the invention.

In this embodiment, the level of changes with time is detected using a plurality of monitoring light emitting elements, and a video signal or a power supply potential is corrected based on the detection result, thereby changes with time of a light emitting element are corrected. Such a case is described with reference to FIG. 19.

This embodiment uses a plurality of (at least two) monitoring light emitting elements, and two monitoring light emitting elements 1001 and 1002 are provided herein. A constant current is supplied to one light emitting element 1001 from a constant current source 1003 while a constant current is supplied to the other light emitting element 1002 from a constant current source 1004.

When the current supplied from the constant current source 1003 differs from the current supplied from the constant current source 1004, the total amounts of current flowing through the monitoring light emitting elements 1001 and 1002 are different from each other. Thus, changes with time progress at different rates in the monitoring light emitting elements 1001 and 1002.

The monitoring light emitting elements 1001 and 1002 are connected to an arithmetic circuit 1005 that calculates a potential difference (voltage difference) between one electrode of the monitoring light emitting element 1001 and one electrode of the monitoring light emitting element 1002.

A voltage calculated by the arithmetic circuit 1005 is supplied to a video signal generating circuit 1006. In the video signal generating circuit 1006, a video signal supplied to each pixel is corrected based on the voltage supplied from the arithmetic circuit 1005. According to the aforementioned structure, changes with time of the light emitting element can be corrected.

In the pixel shown in FIG. 6B, the gate electrode of the transistor 92 is connected to the power supply line Vax with a constant potential, thereby the transistor 92 operates in a saturation region and light emission or non-light emission of the light emitting element 13 is controlled by a video signal. In such a case, the video signal is not corrected and the potential of the power supply line Vax may be changed based on a voltage supplied from the arithmetic circuit 1005.

The power supply line Vax is connected to a power supply circuit 1007 that corrects the potential of the power supply line Vax based on a voltage supplied from the arithmetic circuit 1005.

According to the display device of this embodiment having the aforementioned structure, correction can be performed in accordance with changes with time.

It is preferable that a circuit for preventing fluctuations in potential, such as a buffer amplifier, be provided between the monitoring light emitting element 1001 and the arithmetic circuit 1005 and between the monitoring light emitting element 1002 and the arithmetic circuit 1005.

Figure 20A:
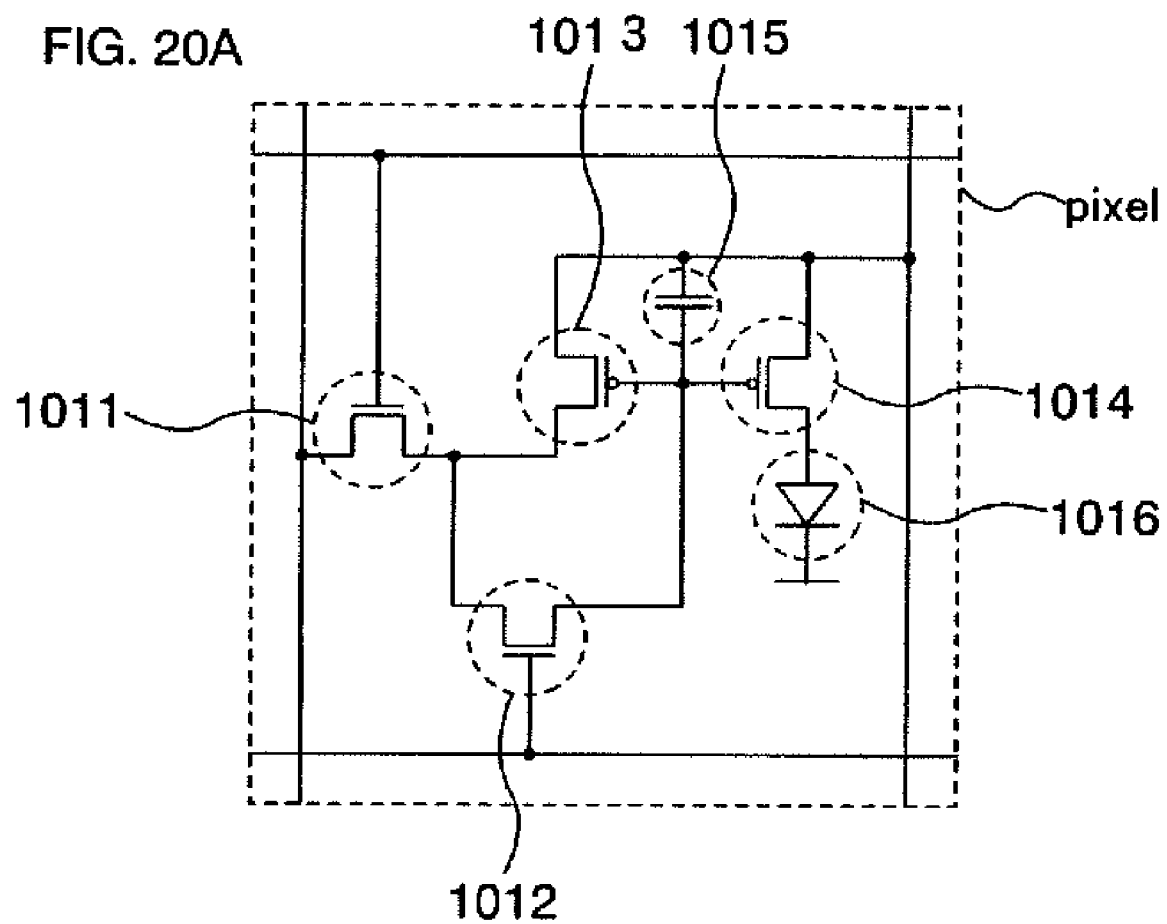
FIGS. 20A and 20B are diagrams each showing a configuration of a display device of the invention.
Figure 20B:
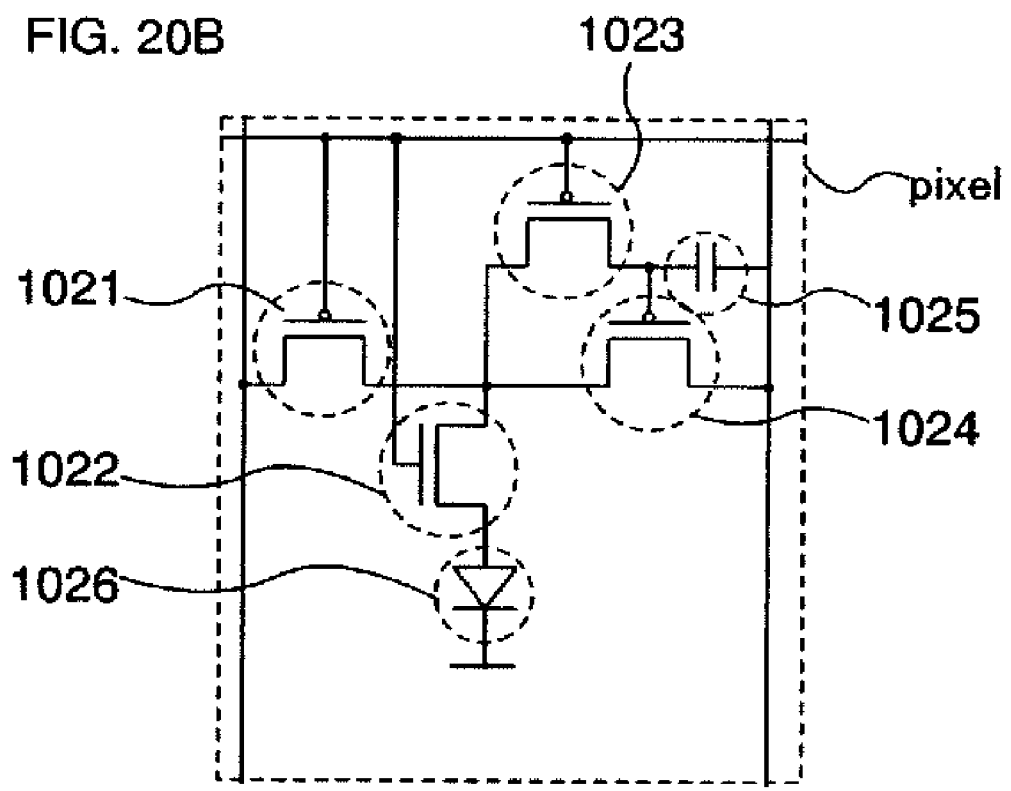

As a pixel having a configuration for performing the constant current drive, for example, a pixel using a current mirror circuit shown in FIG. 20A, a pixel using another configuration shown in FIG. 20B, and the like may be adopted.

A pixel using a current mirror circuit has transistors 1011 to 1014, a capacitor 1015, and a light emitting element 1016 (see FIG. 20A). The current mirror circuit is constituted by the transistors 1013 and 1014. A current flowing through the light emitting element 1016 is equivalent to a current flowing between a source and a drain of the transistor 1014. A current flowing between a source and a drain of each of the transistors 1013 and 1014 depends on charges held in the capacitor 1015. A pixel having another configuration has transistors 1021 to 1024, a capacitor 1025, and a light emitting element 1026 (see FIG. 20B).

Embodiment 3

Figure 21:
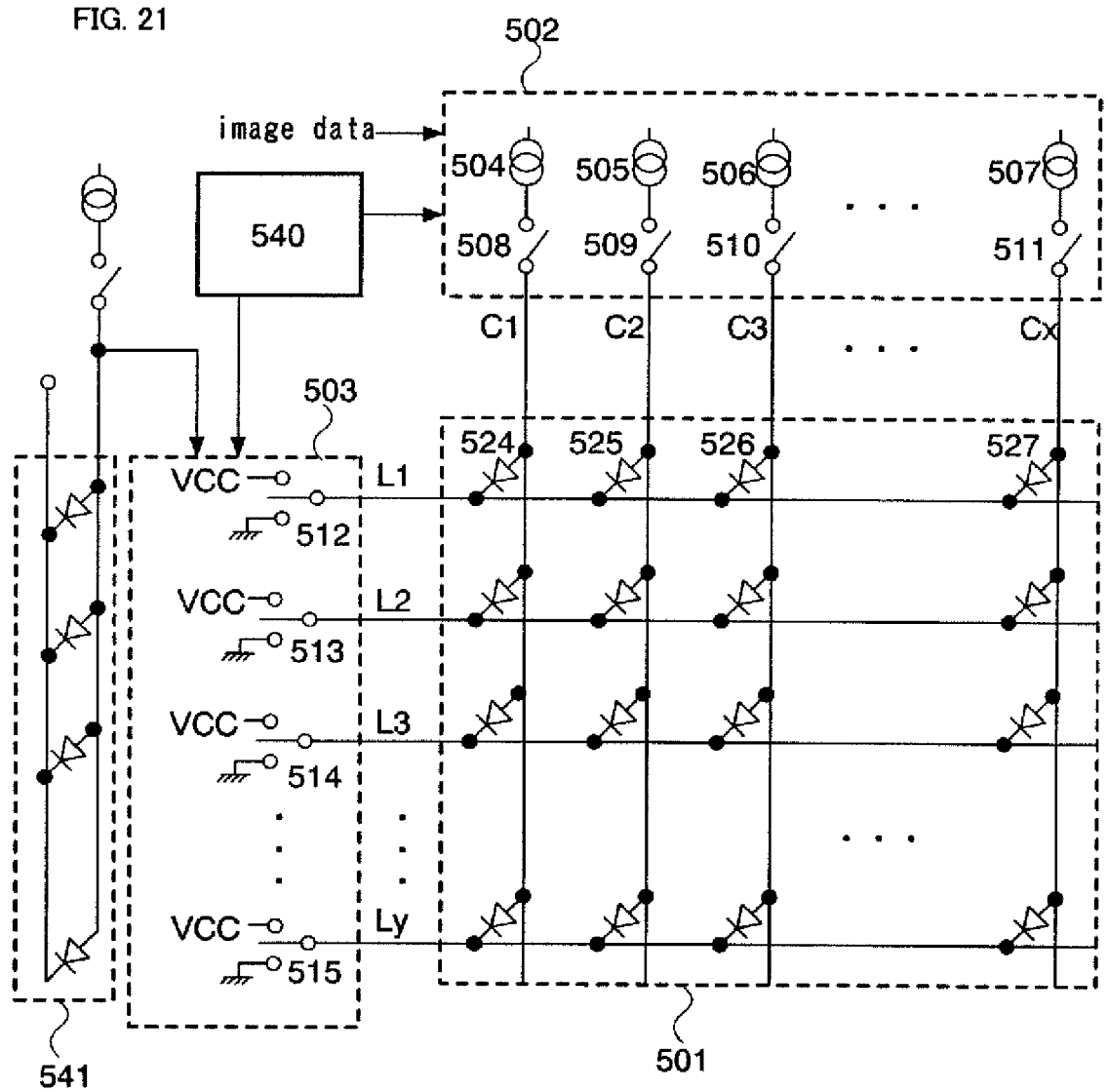
FIG. 21 is a diagram showing a configuration of a display device of the invention.

A passive matrix display device using the invention is described with reference to FIG. 21. A passive matrix display device has a pixel portion 501 formed over a substrate, a column signal line driver circuit 502 and a row signal line driver circuit 503 disposed at the periphery of the pixel portion 501, and a controller 540 for controlling the column signal line driver circuit 502 and the row signal line driver circuit 503. The pixel portion 501 has x column signal lines C1 to Cx arranged in the column direction, y row signal lines L1 to Ly arranged in the row direction, and a plurality of light emitting elements arranged in matrix (x and y are natural numbers). The column signal line driver circuit 502 and the row signal line driver circuit 503 are constituted by an LSI chip and connected to the pixel portion 501 formed over the substrate through an FPC. A monitoring circuit 541 is provided over the same substrate as the pixel portion 501.

Operation of the passive matrix display device is briefly described below. First, a row signal line L1 of the first row is selected. More specifically, the row signal line L1 is connected to a ground potential through a switch 512. Then, when switches 508 to 511 of the column signal line driver circuit 502 are brought into a conductive state, currents from constant current sources 504 to 507 are supplied to light emitting elements 524 to 527 arranged in the first row. Gray scale display is achieved by the amount of current supplied from the constant current sources 504 to 507 and the length of time during which currents are supplied to the light emitting elements 524 to 527. When the switches 508 to 511 are brought into a non-conductive state and the row signal line L1 is connected to Vcc through the switch 512, reverse bias voltages are applied to the light emitting elements 524 to 527 of the first row. Such operation is repeated from the first row to the last row.

Figure 16:
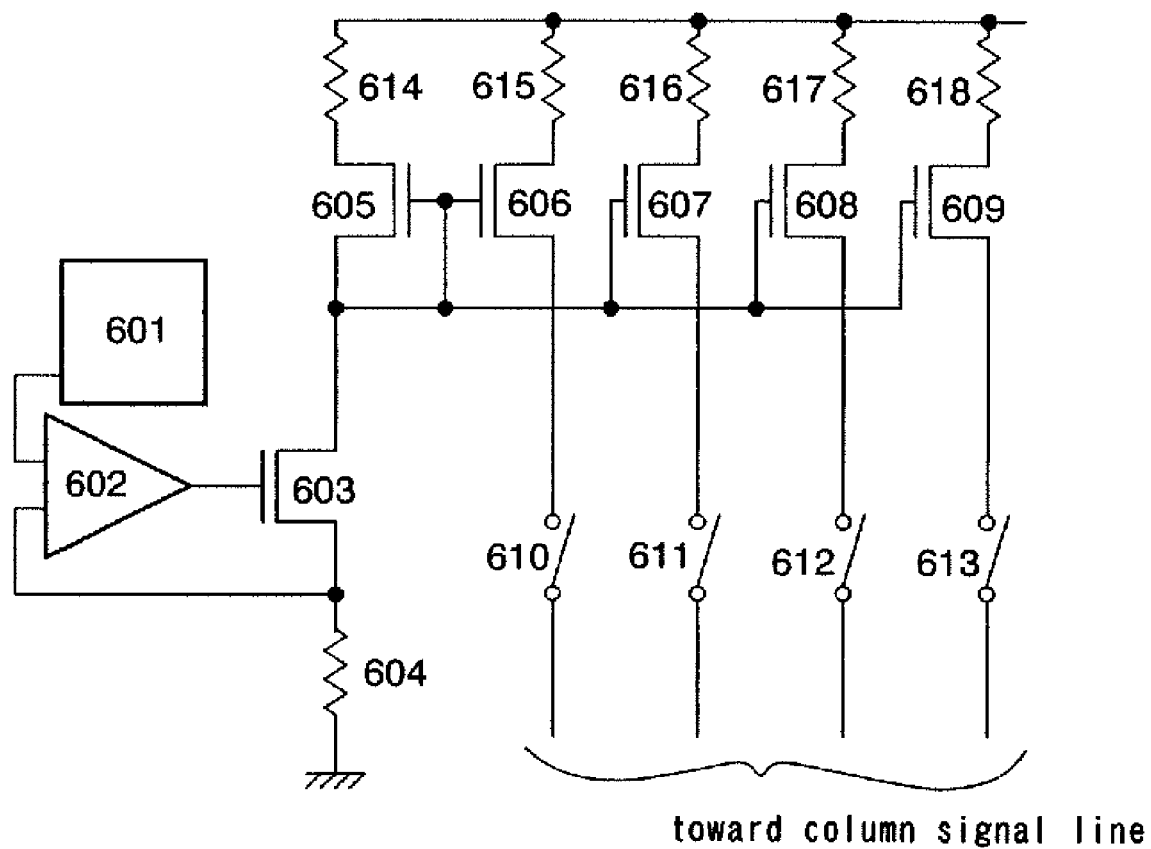
FIG. 16 is a diagram showing a configuration of a display device of the invention.

FIG. 16 shows a configuration example of the column signal line driver circuit 502. A constant voltage source 601 has a function of generating a constant voltage and uses a known constant voltage source with a small temperature coefficient such as a band gap regulator. A voltage generated from the constant voltage source 601 is converted into a constant current with a small temperature coefficient by an operational amplifier 602, a transistor 603, and a resistor 604. The converted current is reversed and copied by current mirror circuits constituted by transistors 605 to 609 and resistors 614 to 618, and then supplied to the column signal lines C1 to Cx through switches 610 to 613.

According to the display device of this embodiment, video data inputted to the column signal line driver circuit 502 or a voltage generated from the constant voltage source 601 is corrected using the monitoring circuit 541 in accordance with temperature changes and changes with time, thereby the influences of changes in temperature and changes with time can be prevented.

This application is based on Japanese Patent Application serial No. 2004-152624 filed in Japan Patent Office on May 21, 2004, and Japanese Patent Application serial No. 2004-191833 filed in Japan Patent Office on Jun. 29, 2004, the contents of which are hereby incorporated by reference.

What is claim is:

1. A display device comprising:
    a first light emitting element;
    a driving transistor connected in series to the first light emitting element;
    a monitoring second light emitting element;
    a limiter transistor connected in series to the monitoring second light emitting element;
    a constant current source for supplying a constant current to the monitoring second light emitting element; and
    a circuit for outputting a potential corresponding to a potential which is inputted to said circuit,
    wherein a first electrode of the first light emitting element is connected to an output terminal of the circuit through the driving transistor;
    wherein a first electrode of the monitoring second light emitting element is electrically connected to an input terminal of the circuit through the limiter transistor; and
    wherein a channel length L1 and a channel width W1 of the driving transistor, and a channel length L2 and a channel width W2 of the limiter transistor satisfy L1/W1:L2/W2=1:2 to 1:10.

2. A display device comprising:
    a first light emitting element;
    a monitoring second light emitting element;

a transistor connected in series to the monitoring second light emitting element;
a constant current source for supplying a constant current to the monitoring second light emitting element; and
a circuit for outputting a potential corresponding to a potential which is inputted to said circuit,
wherein a first electrode of the first light emitting element is electrically connected to an output terminal of the circuit;
wherein a first electrode of the monitoring second light emitting element, a gate electrode of the transistor, and one of a source electrode and a drain electrode of the transistor are connected to an input terminal of the circuit; and
wherein the other of the source electrode and the drain electrode of the transistor is connected to an AC power supply.

3. A display device comprising:
a first light emitting element;
a monitoring second light emitting element;
a transistor connected in series to the monitoring second light emitting element; and
a circuit for outputting a potential corresponding to a potential which is inputted to said circuit;
wherein a first electrode of the first light emitting element is electrically connected to an output terminal of the circuit;
wherein a first electrode of the monitoring second light emitting element and one of a source electrode and a drain electrode of the transistor are connected to an input terminal of the circuit;
wherein a gate electrode of the transistor is connected to a first power supply; and
wherein the other of the source electrode and the drain electrode of the transistor is connected to a second power supply.

4. The display device according to claim 3, wherein the transistor operates in a saturation region.

5. A display device comprising:
a first light emitting element;
a monitoring second light emitting element;
a constant current source for supplying a constant current to the monitoring second light emitting element;
a circuit for outputting a potential corresponding to a potential which is inputted to said circuit; and
a resistor provided between a first electrode of the monitoring second light emitting element and an input terminal of the circuit;
wherein a first electrode of the first light emitting element is electrically connected to an output terminal of the circuit.

6. A display device comprising:
a first light emitting element;
a switching transistor;
a monitoring second light emitting element;
a forward bias transistor connected in series to the monitoring second light emitting element;
a constant current source for supplying a constant current to the monitoring second light emitting element; and
a circuit for outputting a potential corresponding to a potential which is inputted to said circuit;
wherein a first electrode of the first light emitting element is electrically connected to an output terminal of the circuit;
wherein a first electrode of the monitoring second light emitting element is connected to an input terminal of the circuit;
wherein a gate electrode of the switching transistor and a gate electrode of the forward bias transistor are connected to a gate line; and
wherein one of a source electrode and a drain electrode of the forward bias transistor is connected to the input terminal of the circuit and the other of a source electrode and a drain electrode of the forward bias transistor is connected to a forward bias power supply.

7. The display device according to claim 1, wherein the circuit is a buffer amplifier.

8. The display device according to claim 1, wherein a second electrode of the first light emitting element and a second electrode of the monitoring second light emitting element are maintained at a constant potential.

9. The display device according to claim 1, wherein the first light emitting element and the monitoring second light emitting element are provided over the same substrate.

10. An electronic device comprising the display device according to claim 1.

11. The display device according to claim 2, wherein the circuit is a buffer amplifier.

12. The display device according to claim 2, wherein a second electrode of the first light emitting element and a second electrode of the monitoring second light emitting element are maintained at a constant potential.

13. The display device according to claim 2, wherein the first light emitting element and the monitoring second light emitting element are provided over the same substrate.

14. An electronic device comprising the display device according to claim 2.

15. The display device according to claim 3, wherein the circuit is a buffer amplifier.

16. The display device according to claim 3, wherein a second electrode of the first light emitting element and a second electrode of the monitoring second light emitting element are maintained at a constant potential.

17. The display device according to claim 3, wherein the first light emitting element and the monitoring second light emitting element are provided over the same substrate.

18. An electronic device comprising the display device according to claim 3.

19. The display device according to claim 5, wherein the circuit is a buffer amplifier.

20. The display device according to claim 5, wherein a second electrode of the first light emitting element and a second electrode of the monitoring second light emitting element are maintained at a constant potential.

21. The display device according to claim 5, wherein the first light emitting element and the monitoring second light emitting element are provided over the same substrate.

22. An electronic device comprising the display device according to claim 5.

23. The display device according to claim 6, wherein the circuit is a buffer amplifier.

24. The display device according to claim 6, wherein a second electrode of the first light emitting element and a second electrode of the monitoring second light emitting element are maintained at a constant potential.

25. The display device according to claim 6, wherein the first light emitting element and the monitoring second light emitting element are provided over the same substrate.

26. An electronic device comprising the display device according to claim 6.

* * * * *

UNITED STATES PATENT AND TRADEMARK OFFICE
CERTIFICATE OF CORRECTION

| | | |
|---|---|---|
| PATENT NO. | : 7,834,355 B2 | |
| APPLICATION NO. | : 12/348574 | |
| DATED | : November 16, 2010 | |
| INVENTOR(S) | : Masahiko Hayakawa | |

It is certified that error appears in the above-identified patent and that said Letters Patent is hereby corrected as shown below:

Column 11, line 59, replace "1=x=m" with --$1 \leq x \leq m$--;

Column 11, line 60, replace "1=y=n" with --$1 \leq y \leq n$--;

Column 12, line 10, replace "1=x=m" with --$1 \leq x \leq m$--;

Column 18, line 20, replace "1=i,j,k,p=n" with --$1 \leq i,j,k,p \leq n$--;

Column 18, line 28, replace "1=y=n" with --$1 \leq y \leq n$--;

Column 18, line 42, replace "G1" with --Gi--;

Column 18, line 43, replace "G1" with --Gi--;

Column 18, line 44, replace "G1" with --Gi--;

Column 18, line 60, replace "G1" with --Gi--;

Column 18, line 60, replace "G1" with --Gi--;

Column 18, line 61, replace "G1" with --Gi--;

Column 19, line 17, replace "G1" with --Gi--;

Column 19, line 21, replace "G1" with --Gi--;

Column 19, line 28, replace "TFt" with --TFT--;

Column 19, line 55, replace "1=x=m" with --$1 \leq x \leq m$--.

Signed and Sealed this
Thirty-first Day of July, 2012

David J. Kappos
*Director of the United States Patent and Trademark Office*